(12) United States Patent
Iseki et al.

(10) Patent No.: US 7,666,490 B1
(45) Date of Patent: Feb. 23, 2010

(54) FUNCTIONAL ROLL FILM AND VACUUM EVAPORATION APPARATUS CAPABLE OF PRODUCING THE FUNCTIONAL ROLL FILM

(75) Inventors: Kiyoshi Iseki, Ohtsu (JP); Seiichiro Yokoyama, Ohtsu (JP); Takahiro Kubota, Ohtsu (JP); Hiroshi Fujita, Ohtsu (JP); Tsukasa Ohshima, Ohtsu (JP); Shuji Hidaka, Ohtsu (JP); Yoshinori Takada, Ohtsu (JP); Yozo Yamada, Ohtsu (JP); Shinji Suzuki, Ohtsu (JP)

(73) Assignee: Toyo Boseki Kabushiki Kaisha, Osaka (JP)

( * ) Notice: Subject to any disclaimer, the term of this patent is extended or adjusted under 35 U.S.C. 154(b) by 0 days.

(21) Appl. No.: 09/500,132

(22) Filed: Feb. 8, 2000

(30) Foreign Application Priority Data

| Feb. 10, 1999 | (JP) | ................................. 11-032129 |
| Feb. 16, 1999 | (JP) | ................................. 11-036605 |
| Jul. 2, 1999 | (JP) | ................................. 11-189536 |

(51) Int. Cl.
 B32B 7/02 (2006.01)
 B32B 9/00 (2006.01)
 B32B 19/00 (2006.01)

(52) U.S. Cl. ...................... 428/156; 428/702; 428/213; 428/906; 428/34.7

(58) Field of Classification Search .................. 428/906, 428/702, 213, 156, 172, 141, 143, 148, 457, 428/458, 461, 462, 446, 34.7
See application file for complete search history.

(56) References Cited

U.S. PATENT DOCUMENTS

| 3,676,612 | A | * | 7/1972 | Kobayashi et al. ............ 360/16 |
| 4,571,361 | A | * | 2/1986 | Kawaguchi et al. ......... 428/328 |
| 5,230,923 | A | * | 7/1993 | Hirokawa et al. ........ 427/248.1 |
| 5,242,500 | A | | 9/1993 | Elvers et al. ................. 118/718 |
| 5,378,506 | A | * | 1/1995 | Imai et al. .................... 427/529 |
| 5,462,779 | A | * | 10/1995 | Misiano et al. ............. 428/34.7 |
| 5,529,832 | A | * | 6/1996 | Masuda et al. .............. 428/212 |
| 5,725,958 | A | * | 3/1998 | Matsuda et al. ............. 428/446 |
| 5,770,301 | A | * | 6/1998 | Murai et al. ................. 428/213 |
| 5,792,550 | A | * | 8/1998 | Phillips et al. .............. 428/336 |
| 6,261,663 | B1 | * | 7/2001 | Peiffer et al. ................. 428/141 |

FOREIGN PATENT DOCUMENTS

| DE | 1 521 555 | | 2/1970 |
| DE | 15 21 555 | | 2/1970 |
| EP | 0 570 182 A1 | | 11/1993 |
| EP | 0 812 779 | | 12/1997 |
| JP | 60-61649 | | 4/1985 |
| JP | 60 215760 | | 10/1985 |
| JP | 1-113234 | | 9/1989 |
| JP | 4-118509 | | 4/1992 |
| JP | 4 354872 | | 12/1992 |
| JP | 4354872 A | | 12/1992 |
| JP | 6235061 A | | 8/1994 |
| JP | 6-330318 | | 11/1994 |
| JP | 06330318 | * | 11/1994 |

OTHER PUBLICATIONS

Patent Abstracts of Japan, vol. 010, No. 078 (C-335), Mar. 27, 1986 & JP 60 215760 A (Mitsubishi Denki KK), Oct. 29, 1985.

(Continued)

Primary Examiner—David R Sample
Assistant Examiner—Catherine Simone
(74) Attorney, Agent, or Firm—Kenyon & Kenyon LLP

(57) ABSTRACT

A functional roll film comprises a plastic film which is transparent and having gas barrier properties, and provided at its at least one surface with an inorganic oxide layer, and which can be wound; wherein a maximum thickness of the inorganic oxide layer is 1.5 times of a minimum thickness.

8 Claims, 12 Drawing Sheets

OTHER PUBLICATIONS

Patent Abstracts of Japan, vol. 017, No. 216, (C-1053), Apr. 28, 1993 & JP 04 354872 A (Toppan Pronting Co., Ltd.), Dec. 9, 1992.
Communication from European Patent office regarding correspnding European patent Application, May 26, 2003.
Notification of Reason(s) for Refusal, from Japanese Patent Office, submitted Jan. 16, 2003.
Casey, F. And A. Broomfield, "Control of Metal Deposition in a Web Coater Controlling in Both Transverse and Machine Directions", Society of Vacuum Coaters, 33$^{rd}$ Annual Technical Conference Proceedings, Apr. 29-May 4, 1990, New Orleans, LA, pp. 157-162.

Misiano, C. et al., "D.O.B. : A New Product for Transparent and Colorless Barrier Coating", Society of Vacuum Coaters, 36$^{th}$ Annual Technical Conference Proceedings, Apr. 25-30, 1993, Dallas TX, pp. 307-311.

* cited by examiner (a)

(b)

FUNCTIONAL ROLL FILM AND VACUUM EVAPORATION APPARATUS CAPABLE OF PRODUCING THE FUNCTIONAL ROLL FILM

BACKGROUND OF THE INVENTION

1. Field of the Invention

The present invention relates to a functional roll film and a vacuum evaporation apparatus capable of producing the functional roll film, and more particularly, to a functional roll film having excellent characteristics as a packaging material requiring hermeticity for a food product, a medical product, electronic parts and the like having excellent transparency, gas barrier properties, printing properties, flexibility and the like, or as a gas shut-out material, and the invention also relates to vacuum evaporation apparatus capable of producing such a functional roll film.

2. Description of the Related Art

A functional roll film such as a transparent gas barrier film comprises an inorganic matter laminated on a plastic film which is a base material. As the inorganic matter, a metal oxide is widely utilized for enhancing transparency. As the metal oxide, films on which silicon oxide, aluminum oxide, magnesium oxide or a mixture of these elements is laminated by a vacuum evaporation method using a vacuum evaporation apparatus or a CVD method using a CVD apparatus are commercially available. The produced transparent gas barrier film is cut into pieces by a slitter, each having a width of about 400 to 1,000 mm and a length of about 4,000 to 10,000 m, and each pieces is wound around a paper core and is put into circulation in a form of a film roll. Converter makers laminate another film or paper on the take-up film, or print the wound film onto a transparent gas barrier film and then, further laminate another film thereon, and produce various packaging laminated films.

Naturally, performance of the transparent gas barrier film largely depends on the thickness of its inorganic thin film layer. Barrier performance of the transparent gas barrier film that a thin film layer is laminated on the plastic film has a tendency that gas permeability is reduced as the thickness of the thin film layer is increased from a state in which nothing is laminated. However, if the thickness of the thin film exceeds a certain film thickness, the reduction effect of gas permeability is not enhanced as compared with the increase in the film thickness. On the contrary, if the thickness is excessively increased, the flexibility of the thin film is lowered, and the thin film layer is prone to be broken, and there is a problem that the gas barrier performance is lowered. Therefore, it is preferable that the thin film layer is formed with a minimum thickness in which the gas barrier properties are stable.

On the other hand, when the transparent gas barrier film is produced, the thickness of the thin film layer must be controlled, but under present circumstances, an optical monitor used for measuring the thickness of the thin film does not have excellent precision of film thickness measurement in generally. The thickness of the thin film is measured by illuminating a plastic film on which a thin film layer is laminated from one side of the film, receiving the transmitted light from the other side, and calculating the thickness of the thin film by the intensity of the light. However, the thin film layer of the transparent gas barrier film has excellent light transmission properties, a variation in the light transmission amount is small as compared with a variation in film thickness and therefore, the measurement precision is not excellent.

On the other hand, if a degree of oxidation of silicon oxide or aluminum oxide is varied, the thin film layer is colored and the light transmissivity is varied. Thereupon, in order to avoid such an influence, light having a specific wavelength is used. However, it is still difficult to measure the thickness of the thin film with sufficient precision.

Conventionally, since the thickness of the thin film is measured using such an optical monitor of low precision, even if an attempt is made to control the thickness of the thin film based on the measured result of the monitor, it is impossible to stable the thickness of the thin film within a preferable range.

Thereupon, in order to secure the gas barrier properties in the entire region of the film, an attempt has been made to produce the film such that the minimum thickness of the thin film among the width variation of thickness becomes a thickness which stabilizes the gas barrier properties.

However, since the measuring precision of the thickness of the thin film itself is not excellent, the variation in thickness of the thin film is inevitably increased, and especially when the laminated inorganic matter layer is composite oxide, it is extremely difficult to precisely measure its component and therefore, it becomes more difficult to suppress the variation in thickness of the thin film. Therefore, with the conventional apparatus, it is difficult to obtain a transparent gas barrier film roll having stable thickness and composition of the thin film and stable gas barrier properties.

SUMMARY OF THE INVENTION

Thereupon, it is an object of the present invention to provide a high-quality functional roll film having stable thickness and composition of the thin film and gas barrier properties capable of solving the conventional problems, and a vacuum evaporation apparatus capable of producing such a functional roll film.

A functional roll film of the present invention comprises; a plastic film which is transparent and having gas barrier properties, and provided at its at least one surface with an inorganic oxide layer (the thin film), and which can be wound; wherein a maximum thickness of the inorganic oxide layer is 1.5 times or less of a minimum thickness of the thin film.

With this structure, it is possible to stably secure the flexibility of the inorganic oxide layer and gas barrier properties, and to secure excellent transparency. If the maximum value of the thickness of the inorganic oxide layer exceeds 1.5 times of the minimum value, the flexibility of a thick portion of the inorganic oxide layer is lowered, and there is an adverse possibility that the layer is cut from this portion, and the gas barrier properties are lowered and thus it is not preferable.

As a result, according to the present invention, a functional roll film having uniform thickness and composition can be obtained, and a final product after working such as printing, laminating, and packing exhibits excellent various functions such as gas barrier properties and transparency, and since it is enough to form only the necessary but minimum thickness of the thin film layer, it is possible to efficiently carry out the producing process such as vacuum evaporation, and it is economical.

The inorganic oxide matter in the present invention includes metal oxide such as aluminum oxide and magnesium oxide, and semi-metal oxide such as silicon oxide, as well as complex or compound thereof. Further, inorganic oxide matter which is not oxidized completely and is slightly lacking oxygen, such as inorganic oxide matter having composition which does not fall in stoichiometric composition such as $SiO_x$ (x=1.5 to 1.9) is also included.

The optimal thickness of the inorganic oxide layer differs according to its kind and state, but in generally, the thickness of the inorganic oxide layer is, it is not limitative, 5 to 300 nm, and more preferably, 10 to 50 nm in view of the gas barrier properties and flexibility. The thinner, the better, as long as the gas barrier properties and retort properties can be satisfied.

The maximum value and the minimum value of the film thickness of the inorganic oxide layer mentioned in the present invention respectively mean a thickness of the thickest portion and a thickness of the thinnest portion of the thickness measured in one production unit, e.g., one roll unit of a plastic film which is winded. The thickness of the thin film may be a value directly measured using an electron microscope, or a value indirectly measured based on a previously prepared calibration curve using a fluorescent X-ray analyzer.

The plastic film mentioned in the present invention corresponds to a film and the like produced by melting and extruding organic high polymer, and drawing it in a longitudinal direction and/or a widthwise direction if necessary, and cooling it and fixing its temperature. The organic high polymer includes polyethylene, polypropylene, polyethylene terephthalate, polyethylene 2, 6 naphthalete, nylon 6, nylon 4, nylon 66, nylon 12, polyvinyl chloride, polyvinylidene chloride, polyvinyl alcohol, all aromatic polyamide, polyamide-imide, polyimide, polyeterimide, polysulfon, polyphenylene sulfide, polyphenylene oxide and the like. A small amount of these (organic polymers) organic high polymers may be co-polymerized or blended with another organic polymer.

To this organic high polymer, a known additive, such as ultraviolet absorbent, anti-static agent, plasticizer, lubricant, stainer and the like may be added. A transparency of the organic high polymer is not especially limited, but when the transparency thereof is utilized, transmittance of 70% or higher is preferable.

Prior to lamination of the thin film layer, a surface of the plastic film used in the present invention may be subjected to a corona discharging treatment, a glow discharging treatment and other surface rough treatment, or a known anchor coating treatment.

A thickness of the plastic film used in the present invention is not especially limited, but it is preferable that the thickness is in a range of 5 to 1,000 μm, and more preferably, 10 to 500 μm.

As means for achieving the present invention, when an evaporated film (a film laminated the thin film) is slit into a small film roll, the thickness of the thin film may be measured, and portions of the film which are out of spec. may be removed such that the film falls in a predetermined range. However, this method is inferior in yield and not preferable economically. Thereupon, it is preferable that monitors utilizing fluorescent X-rays which will be described later are disposed at certain distances from one another in a transverse direction (TD, hereinafter) of the film, and measurement is carried out continuously, so that the film thickness can be measured also in the machin direction (MD, hereinafter) of the film, and the apparatus is produced while controlling.

When the inorganic oxide layer of the functional roll film comprises a composite oxide matter in which at least two kinds of oxide matters are mixed, it is preferable that the difference between the maximum value and the minimum value of the composition of one component of the composite oxide matter is within 20 wt %.

With this structure, even if the inorganic oxide layer is a compound layer comprising the composite oxide matters, it is possible to obtain a functional roll film having various functions such as stable gas barrier properties and transparency.

The fact that the difference between the maximum value and the minimum value of the composition of one component of the composite oxide matter is within 20 wt % means a difference between values when composition ratio of each of the components are expressed by weight percentage. Similar to film thickness, among compositions of any of components measured in one film per one roll of the films, a value of the maximum concentration portion and a value of the minimum concentration portion are called as the maximum value and the minimum value of the composition of the one component.

It is preferable that static electricity of the plastic film having the inorganic oxide layer is in a range from −10 kV to +10 kV.

The plastic film on which the inorganic oxide layer is laminated is prone to become charged during producing procedure, and if the film becomes charged, static electricity is discharged in a laminating step, and there are possibilities that the inorganic oxide layer is destroyed, and gas barrier properties are lowered, and a hole is made in the plastic film itself. Further, there is an adverse possibility that the organic solvent may be ignited and catch fire. In the printing process, if electrification is great, mustache (ink splashing) may be generated and printing quality is deteriorated. However, if the static electricity of the plastic film having the inorganic oxide layer is in the above-described range, it is possible to reliably avoid the above possibilities.

The static electricity mentioned in the present invention means that electric charge exists on a surface of the plastic film, and its intensity is indicated with the electric potential on the surface. The surface electric potential can be measured using commercially available static electricity measuring device, such as a rotation sector type static electricity locator, a current collector type static electricity locator, a pulse synchronizing type static electricity locator, a static electricity inductive type static electricity locator or the like. In an example which will be described later, as a measurement condition of the surface electric potential, a take-up film was measured in an atmosphere having a temperature of 23° C. and humidity of 50%, while winding the film at speed of 10 m/min.

As a method of the present invention for controlling the surface electric potential within a range from −10 kV to +10 kV, there is a method in which a high-precision thickness monitor is used when a plastic film having an inorganic oxide layer is produced by vacuum evaporation method, a variation in width of the film thickness is suppressed within ±20% (more preferably, ±10%) in a roll of at least a plastic film, and when it is slit into a size suitable for handling, a room temperature is controlled to 20° C. or higher and humidity is controlled to 50% or higher, and it is positively diselectrified by a voltage impressing type ionazer.

Further, a vacuum evaporation apparatus of the present invention comprises: a vacuum chamber in which a long plastic film moves; material holding means having a thin partitioning portion to partition an evaporation material; and heating means which is an electron beam gun for heating and evaporating the evaporation material; wherein the partitioning portion is disposed such as to be inclined through substantially the same angle as an angle of incidence of electron beam irradiated from the electron beam gun.

With this structure, since it is possible to partition each of the materials in a heat resistant container capable of holding the evaporation materials, it can be used continuously for a long time, and electron beams can be irradiated very closely to the adjacent evaporation materials. Even when the evaporation material is evaporated and consumed as it is used and its height is lowered, the influence on the partitioning portion can be reduced, and even if it is continuously evaporated for a long time, it is possible to stabilize the thickness of the film uniformly in TD and MD of the plastic film.

Therefore, according to the vacuum evaporation apparatus of the present invention, the inorganic oxide layer whose maximum value of thickness is 1.5 times or less of the minimum value can reliably be formed on the moving plastic film, and even when two or more kinds oxide layers are formed, it is possible to produce a high quality functional roll film in which the difference between the maximum value and the minimum value of the composition of one component of the composite oxide matter is within 20 wt %.

It is preferable that the material holding means is capable of moving in an incident direction of the electron beam or the opposite direction while keeping a parallel relation with respect to a surface of the plastic film onto which the evaporation material is evaporated.

According to this structure, a scanning width of the straightly advancing electron beams in MD can be reduced, and the evaporation rate (deposition rate) from the evaporation material is stabilized. Further, since the height of the evaporation material held in the material holding means can be lowered, a variation in distance between the surface of the evaporation material and the electron beam gun is reduced, which contributes to stability of the evaporation speed. Even if the evaporation material sublimes, the shape of the evaporation portion of the evaporation material can be kept constant, and stable evaporation speed can be obtained. As a result, it is possible to form a further uniform and excellent inorganic oxide layer on the plastic film.

It is preferable that the vacuum evaporation apparatus of the present invention further comprises on-line measuring means, and X-ray irradiation means irradiates X-rays to the plastic film which moves in the vacuum chamber and on which an evaporation material is evaporated by the electron beam gun and an inorganic oxide layer is formed, characteristic X-ray measuring means measure characteristic X-ray intensity which is excited by the X-ray irradiation, and the on-line measuring means outputs a thickness or thickness and composition ratio of the inorganic oxide layer.

With this structure, the characteristic X-ray intensity can directly be measured in real time from the inorganic oxide layer formed on the moving film, and it is convenient because such a measured value can be converted and output into data of thickness of the inorganic oxide layer or film thickness and composition ratio.

Further, it is preferable the vacuum evaporation apparatus of the present invention further comprises: evaporation distribution estimating means for estimating evaporation amount distribution for each of partitioned materials in the material holding means based on data of the measured thickness, or the thickness and the composition ratio of the inorganic oxide layer; first control amount computing means for calculating an energy amount for each of the materials based on a relational equation between a deviation amount of a preset evaporation amount distribution reference value for each of the materials partitioned in the material holding means and the estimated evaporation distribution, the preset energy amount for each of the materials partitioned in the material holding means and an evaporation rate, and for determining an output of the electron beam gun from a total sum of the calculated energy amount for each of the materials; second control amount computing means for determining an electron beam irradiation time for each of the materials partitioned in the material holding means based on a ratio of the calculated energy amount; and electron beam gun control means for controlling a heating operation by the electron beam gun based on computed results by the first and second control amount computing means.

With this structure, the characteristic X-ray intensity can be measured directly in real time from the evaporation film formed on the moving film by the evaporation component evaporated from each of the evaporation sources disposed in the widthwise direction of the running plastic film, and the energy amount to be applied to the evaporation sources can be extracted with high precision from the measured value, and the electron beam gun can be automatically controlled. Therefore, the evaporation film having a target composition ratio and a target thickness can be continuously and uniformly formed on the running film over its entire widthwise direction and longitudinal direction.

Further, a vacuum evaporation apparatus of the present invention comprises: a vacuum chamber in which a long plastic film moves; material holding means for holding the evaporation material; heating means for heating and evaporating the evaporation material so that the evaporation material is evaporated onto the plastic film; and on-line measuring means; wherein X-ray irradiation means irradiates X-rays (primary X-rays) to the plastic film which moves in the vacuum chamber and on which an evaporation material is evaporated by the heating means and an inorganic oxide layer is formed, characteristic X-ray measuring means measure characteristic X-ray intensity which is excited by the X-ray irradiation, and the on-line measuring means outputs a thickness or thickness and composition ratio of the inorganic oxide layer, the on-line measuring means has: standard plate moving means for moving a standard plate including a plurality of standard samples having known characteristics into and out from an irradiation light path of the X-ray; correcting means for correcting the characteristic X-ray intensity measured by the characteristic X-ray measuring means based on the measured value of the characteristic X-ray intensity obtained from the standard sample; and thickness outputting means for outputting thickness or thickness and composition ratio of the inorganic oxide layer based on the corrected characteristic X-ray intensity.

With this structure, since the characteristic X-ray intensity can be measured directly in real time from the inorganic oxide layer formed on the moving film, such a measured value can be converted and output into thickness of the inorganic oxide layer, and based on the thickness data, a preset component target value can be compared, and it is possible to carry out treatments such as obtaining the deviation thereof. Further, since it is possible to feedback control the evaporation speed of the evaporation material based on the treatment, it is possible to form an inorganic oxide layer having a target composition and a target thickness onto the film with high precision. Further, since X-rays are irradiated for measuring the thickness of the evaporated inorganic oxide layer, the inorganic oxide layer is not damaged unlike the irradiation of high-energy electron beams (RHEED; reflection high-energy electron diffraction). In addition, since the standard sample having known characteristics can be inserted into the X-ray irradiation path anytime, if the characteristic X-ray intensity at the standard sample is periodically measured and the preset calibration curve is corrected, even when the characteristic X-ray intensity is lowered because of long time continuous measurement, it is possible to measure stably with high precision. Further, if this vacuum evaporation apparatus is used, not only from a thin film deposited from a single component, but also from a composite thin film formed on the moving film by evaporating from the each evaporation material having different component, measurement results of each of the components and thickness can be obtained with high precision, and similar to the case of the single component thin film, it is possible to the composite thin film layer having a predetermined chemical composition and target thickness can be formed on the film with high precision.

Further, it is preferable that the on-line measuring means has a holding mechanism for keeping, a distance between the characteristic X-ray measuring means and an irradiation position on the plastic film on which the inorganic oxide layer is laminated to be irradiated by the X-ray irradiating means; distance measuring means for measuring a distance between the characteristic X-ray measuring means and the irradiation position on the plastic film; and correcting means for correcting characteristic X-ray intensity measured by the characteristic X-ray measuring means based on a measured result by the distance measuring means.

With this structure, it is possible to use means for measuring the fluorescent X-rays which is sensitive to variation in measuring distance even though the measuring precision is excellent. Therefore, it is convenient because it is possible to continuously measure the thickness and the composition ratio of the inorganic oxide layer comprising a single component or a plurality of components with high precision.

As a holding means for keeping a distance between the characteristic X-ray measuring means and an irradiation position on the plastic film on which the inorganic oxide layer, a roll or the like for supporting the moving plastic film disposed in the vicinity of the X-ray measuring means is admissible.

As the distance measuring means, a length measuring device or the like disposed in the vicinity of the X-ray measuring means can be employed. With this length measuring device, the distance from the roll holding the moving plastic film can be measured, and if the measured result of the X-ray measuring means is corrected using the measured value, it is possible to measure the thickness more precisely.

Further, it is preferable that the on-line measuring means has opening/closing control means for opening or closing an opening/closing apparatus, thereby controlling whether a thin film is formed or not formed onto the plastic film, measured data when the thin film is formed and when the thin film is not formed are compared with each other, thereby correcting the characteristic X-ray intensity measured by the characteristic X-ray measuring means.

With this structure, even when a composite thin film is formed on a plastic film having particle of the same component as that of the evaporation material, since the thickness (converted by its characteristic X-ray intensity) of the particle in the plastic film can be measured previously, if it is corrected based on the particle thickness data when the thickness of the inorganic oxide layer is measured, the thickness of the inorganic oxide layer can be measured with high precision. Further, only when the evaporation thin film is formed on the plastic film surface and it is necessary to correct, the correction can be made, and the apparatus can operate efficiently, and the seam sensor is provided for detecting the seam of the plastic film, and if the opening/closing apparatus is operated in association with this sensor, even when the plastic film which is jointed to another plastic film is continuously evaporated, the correction can be made continuously without stopping the moving of the plastic film, which enhances the convenience.

It is preferable that the on-line measuring means includes the same number of the characteristic X-ray measuring means as components which constitute the inorganic oxide layer.

With this structure, even when the inorganic oxide layer is a composite film, since it is possible to measure the characteristic X-ray intensity of each of the components in real time directly from this composite film, the measured value can be converted and output into thickness data of each of the mixed film components, and based on the thickness data, a target value of each of the components previously set by the control means is compared, and the deviation values thereof can be carried out, the heating means can be feed-back controlled based on such a treatment, and it is possible to form a mixed film having a predetermined chemical composition and a target thickness onto the plastic film with high precision.

It is preferable that a characteristic X-ray measuring device constituting the characteristic X-ray measuring means is a proportional counter or a semiconductor detector.

If the proportional counter is used, a high precision measured result can be obtained, and if the semiconductor detector is used, the entire apparatus can be constructed compact, and even if a plurality of detectors are disposed, a large space is not occupied, and it is possible to measure over the TD of the formed evaporation film.

It is preferable that the characteristic X-ray measuring means is disposed such that an interval of the characteristic X-ray measuring means becomes 100 mm or longer and 500 mm or shorter TD of the plastic film and such that a distance between an evaporation position of the plastic film and the evaporation material held by the material holding means becomes 250 mm or longer.

With this structure, a difference in a thickness and composition value in a position between a value to be measured by the characteristic X-ray measuring means and a measuring position of the characteristic X-ray measuring means where the measurement is not carried out can be brought into a range of ±20%. That is, the value to be measured by the characteristic X-ray measuring means is used as the thickness and composition value at a position between a value to be measured by the characteristic X-ray measuring means and a measuring position of the characteristic X-ray measuring means where the measurement is not carried out, if a distance between positions where the thickness and the composition ratio are measured becomes longer than 500 mm in TD of the film, the values of the thickness and the composition ratio does not coincide with the measured values.

When distance between positions where the thickness and the composition ratio are measured is 500 mm or less in TD of the film, it is preferable because the shorter the distance is, the higher the precision, but if the distance is less than 100 mm, it is inevitably necessary to dispose many thickness meters, and the producing cost of the apparatus is increased. Further, there is a limitation due to the size of the characteristic X-ray measuring means, and the number of the meters to be disposed is also limited. After all, it is especially preferable that the distance between positions where the thickness and the composition ratio are measured is in a range from 100 mm to 500 mm.

Similarly, when a distance between a position of evaporation of the plastic film and the evaporation material held by the material holding means is less than 250 mm, the value of the film thickness composition does not coincide with the measured value. However, if the distance is excessively long, the efficiency of utilization of the evaporation material is lowered, which is not preferable. Preferably, this distance is in a range from 300 mm to 500 mm.

Further, if a method for estimating the thickness and composition between the measuring positions is used such that the thickness and composition distribution function calculated by the evaporation distribution characteristics coincide with the measured points, the thickness and the composition value at positions between the measuring positions of the characteristic X-ray measuring means where the measurement can not be carried out can be estimated within an error of ±10%.

It is preferable that the heating means is an electron beam gun, the electron beam gun being capable of changing output power, a scanning pattern of electron beam and a scanning time of electron beam during evaporation; and the vacuum evaporation apparatus further includes control means for automatically controlling the electron beam gun based on output measured data by the on-line measuring means.

With this structure, it is possible to independently control the output power (intensity of the electron beam), the scanning pattern of the electron beam and the scanning time such that the evaporation condition becomes optimal with respect to the same or different evaporation material in the holding means, and it is preferable because the material can be evaporated onto the moving plastic film in TD and MD uniformly and stably for a long time. This change can be arbitrary be made, or the change can be made in a specific condition.

It is preferable that the on-line measuring means includes control means for controlling a speed of the moving plastic film based on measured thickness data.

With this structure, even when a pressure in the vacuum chamber rises and the evaporation speed is largely reduced irrespective of the fact the control amount of the heating means is constant, and a target inorganic oxide layer thickness can not be obtained, it is possible to continue the evaporation without stopping the evaporation.

It is further preferable that the control means controls the intensity of electron beam to be irradiated to the evaporation material and the scanning time of the electron beam based on the deviation between the measured thickness of composite thin film and the target value, and only when the energy of the electron beam exceeds the preset allowable amount, the control means controls the speed of the running film.

It is preferable that the on-line measuring means includes temperature measuring means for measuring an atmosphere temperature in the vicinity of the characteristic X-ray measuring means, and the correcting means corrects the intensity of characteristic X-ray measured by the characteristic X-ray measuring means based on a measured value of the characteristic X-ray intensity obtained from the standard sample and a temperature obtained by the temperature measuring means.

With this structure, even when spectroscopy that used the crystal that is influenced by temperature easily is used as a constituent element of the characteristic X-ray measuring means, it is possible to measure the thickness of the inorganic oxide layer precisely.

DETAILED DESCRIPTION OF THE PREFERRED EMBODIMENTS

Figure 1:
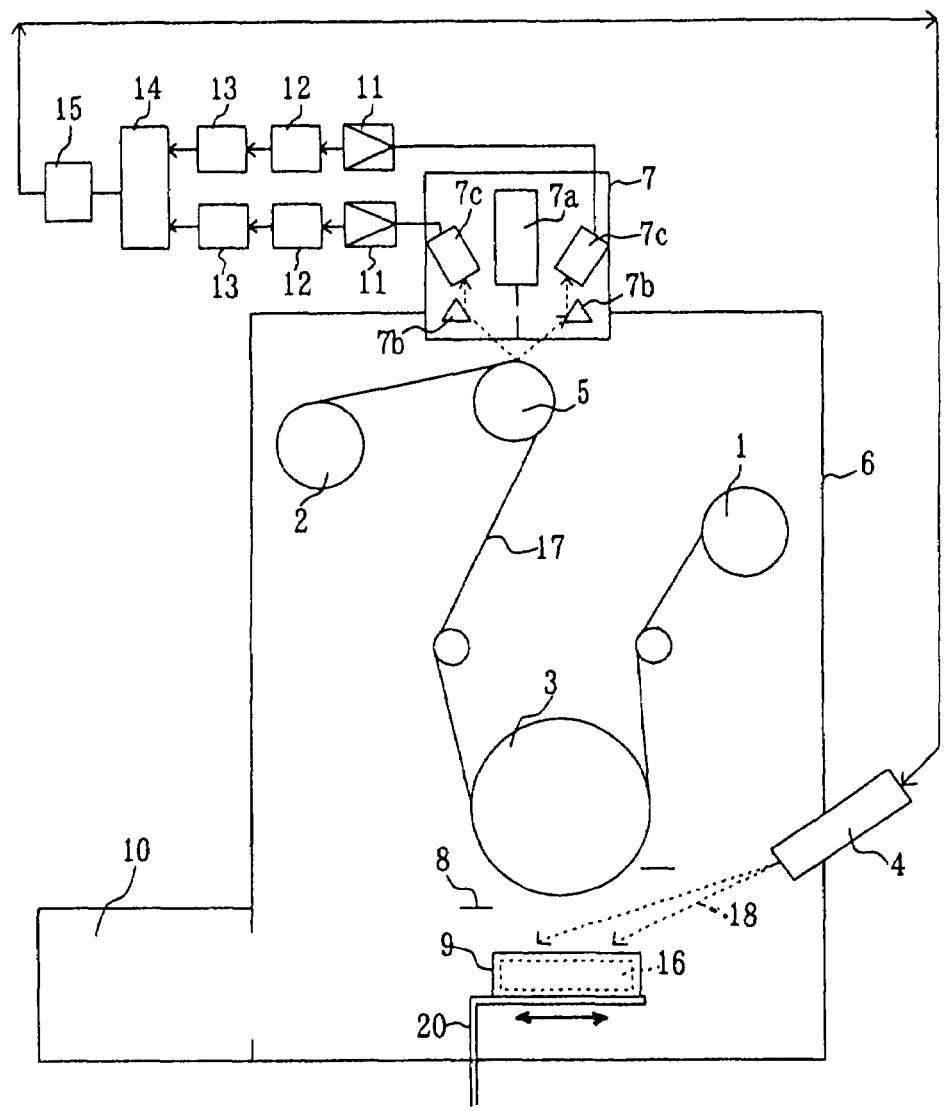
FIG. 1 is a schematic diagram of a vacuum evaporation apparatus according to the present invention.

Embodiments of the present invention will be explained in detail with reference to the drawings. A vacuum evaporation apparatus capable of producing a functional roll film of one of the embodiments is shown in FIG. 1. The vacuum evaporation apparatus includes a fluorescent X-ray monitor 7 (which may be referred to as a monitor hereinafter) for measuring a thickness of a thin film evaporated onto a surface of a plastic film 17. The vacuum evaporation apparatus employs an electron beam heating system, and is constructed in the following manner.

That is, the plastic film 17 set around a delivery roll 1 in a vacuum chamber 6 runs on a cooling roll 3, and is taken up around a take-up roll 2 through a measuring roll 5. The take-up roll 2 is not especially limited, but a plastic film wound around a paper core, plastic core or a metal bobbin of 3 inches, 6 inches or 8 inches as a core can be employed as the take-up roll 2. An easily handling winding length of the plastic film 17 is about 15,000 to 60,000 m winding in the case of thickness of 12 μm, and 15,000 to 30,000 m winding in the case of thickness of 25 μm. It is preferable that a width of the plastic film 17 is 1,000 to 4,000 mm because it is easy to handle.

Vacuum in the vacuum chamber 6 is maintained at a predetermined vacuum (e.g., $4 \times 10^{-2}$ Pa or less) by an evacuation apparatus 10 comprising an oil diffusion pump (not shown). A crucible 9 which is one example of material holding means disposed on the bottom of the vacuum chamber 6 is moved toward an axial direction of an electron beam gun 4 which is one example of heating means at low speed by driving means (not shown) while keeping in parallel to an evaporation surface of the plastic film 17. That is, the crucible 9 is disposed such that irradiation condition (such as the distance between the electron beam gun and an evaporation material) of the electron beams irradiating the evaporation material 16 accommodated in the crucible 9 by moving the crucible 9 toward and away from the electron beam gun 4 shown in FIG. 1. The electron beam gun 4 irradiates electron beams 18 to the evaporation material 16 accommodated in the crucible 9. A portion of the evaporated material heated by the electron beams 18 is evaporated onto the surface of the plastic film 17 running on the cooling roll 3. In the drawing, 8 represents a shutter which is an opening/closing apparatus for forming a uniform and excellent evaporation film onto a to-be evaporated material (in this case, plastic film 17), and 20 represents a cooling pipe through which a cooling water or the like flows for cooling the crucible 9.

Next, monitor 7 will be explained. In the monitor 7, an X-ray generating apparatus 7a for exciting characteristic (fluorescent) X-rays from film constituent component formed on the plastic film is disposed substantially perpendicular to the measuring roll 5. The measuring roll 5 is constructed such that bumps and dips on its roll surface and a roll-out width are small in order to eliminate a variation of the irradiation distance from the X-ray generating apparatus 7a as small as possible. That is, the measuring roll 5 functions as a holding mechanism for constantly holding a distance between the characteristic X-ray measuring means and the irradiation position on the plastic film on which an inorganic oxide layer to be irradiated by the X-ray irradiation means is formed. A surface of the measuring roll is mirror finished, the roll-out width is preferably 200 μm or less, and more preferably, 100 μm or less. It is preferable that the measuring roll 5 is made of hard material comprising component which does not have component constituting an evaporation material as small as possible.

A portion of the characteristic X-rays excited by X-rays substantially perpendicularly irradiated to the evaporated plastic film 17 moving on the measuring roll 5 is guided to spectroscopic crystal plates 7b which are spectroscopic means disposed at about 30° with respect to the surface of the measuring roll 5, and after a wavelength is selected by the spectroscopic crystal plates 7b, the portion of the characteristic X-rays is guided to proportional counters 7c which are characteristic X-ray measuring device. Each of the spectroscopic crystal plates 7b includes the same number of characteristic X-rays excited by X-ray irradiation by the X-ray generating apparatus 7a as the number of components constituting the inorganic oxide layer, and makes it possible to measure each component in real time. The spectroscopic crystal plates 7b and the proportional counters 7c constitute the characteristic X-ray measuring means.

Intensity of the characteristic X-ray continuously measured for a constant time by the proportional counters 7c is converted into analogue electric signal at constant intervals. The analogue electric signal is amplified by amplifiers 11 and then, is converted into a digital signal by analogue/digital converters 12. The characteristic X-ray intensity converted into the digital signal is converted into thickness data at each of elements by thickness computing units 13, and then is input to a control amount computing unit 14. The monitor 7, the amplifiers 11, the analogue/digital converters 12 and the thickness computing units 13 constitute on-line measuring means.

The control amount computing unit 14 compares preset reference thickness data which is a target of each of elements with each of measured thickness data which is input, thereby obtaining a deviation value. Based on the obtained information of the deviation value, control data are automatically generated for controlling the electron beam gun. The control data are sent to an electron beam gun control unit 15. The electron beam gun control unit 15 controls the applied electricity of the electron beam gun 4, the scanning time of the electron beams, and the scanning pattern in accordance with the input control data. The control amount computing unit 14 and the electron beam gun control unit 15 constitute control means.

Next, the crucible 9 which is one example of material holding means will be explained. The one crucible 9 for holding the evaporation material 16 is made of copper, and can be provided at its bottom with the cooling water pipe 20 having an outer diameter of 20 mm Φ as one example. The flow rate of the cooling water is about 4 $m^3$/min. In order to dispose the evaporation material in one line alternately such as to be opposed in TD of the plastic film, partitioning plates 19 made of carbon and having about 2 mm thickness are disposed at distances of 100 mm in the TD in the crucible 9, so that total eight blocks of evaporation material can be accommodated. It is preferable that the thickness of a partitioning portion is 2 to 10 mm, and more preferable, about 5 mm. Although the partitioning portion is preferably thinner, but if the thickness is less than 2 mm, since a life thereof is shortened because of wear due to heating by the heating means, which increases the cost and thus, it is not preferable.

A distance between the partitioning plates 19 in the TD can be 10 to 200 mm. Within this range, composition ratio of the thin film can be uniformed in the TD. If the distance between the partitioning plates is less than 10 mm, the volume of the partitioning plates becomes relatively greater as compared with the evaporation material, refilling frequency of the evaporation material is increased, the evaporation efficiency is deteriorated and thus, it is not preferable. If the distance between the partitioning plates exceeds 200 mm, it becomes difficult to uniformly evaporate different evaporation materials on to a mating material in the TD, and it is not preferable.

It is preferable that the partitioning portion comprises a material including carbon as main component, or a water-cooled metal. If the partitioning portion comprises such material, even if the partitioning portion receives a heat from the evaporation material which is heated by the electron beams or the evaporated evaporation material adhered to the partitioning portion, the partitioning portion itself is prevented from being damaged, which is preferable. It is more preferable that the material including carbon is a carbon-based composite material such as carbon fiber reinforcing carbon material. This is because such a material is less prone to be damaged against the irradiation of electron beams, and heat resistance is high and thus, this portion need not necessarily be cooled. The material including carbon as main component exhibits high energy efficiency because it need not be cooled. On the other hand, if the water-cooled metal is used as the partitioning portion, when evaporation temperatures of adjacent evaporation materials is largely different from each other, it is effective because the heat can be insulated.

The partitioning plates 19 are disposed such as to be inclined through substantially the same angle as the electron beams 18 of the electron beam gun 4 are irradiated to each of the evaporation materials. Since each of the evaporation materials can be partitioned in heat-resistant container capable of holding the evaporation materials, the evaporation material can be continuously used for a long time, electron beams can be irradiated up to a portion very close to each of the adjacent evaporation materials without hindering the irradiation of the electron beams, and also when the height is lowered as the evaporation material is used, the influence on the partitioning portion can be reduced, and even if the material is continuously evaporated for a long time, the thickness of the thin film in the TD and the MD can further be stabilized uniformly, and it is convenient.

Figure 2:
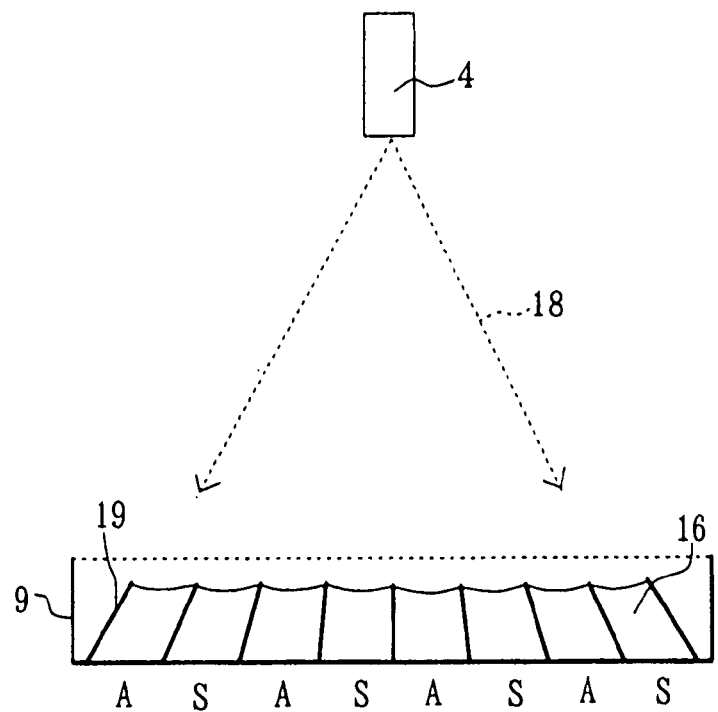
FIG. 2 is a schematic diagram of a crucible used in the vacuum evaporation apparatus shown in FIG. 1.
Figure 3:
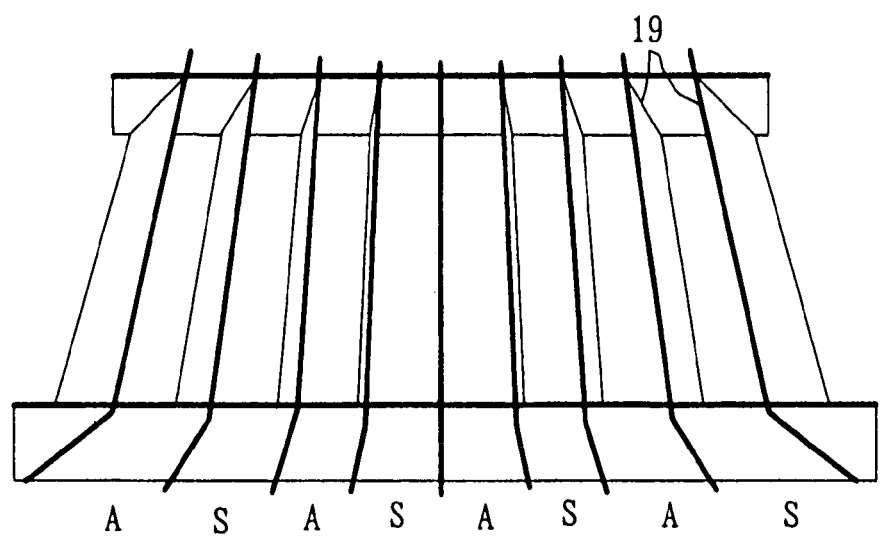
FIG. 3 is a view for explaining a structure of the crucible shown in FIG. 2.
Figure 4:
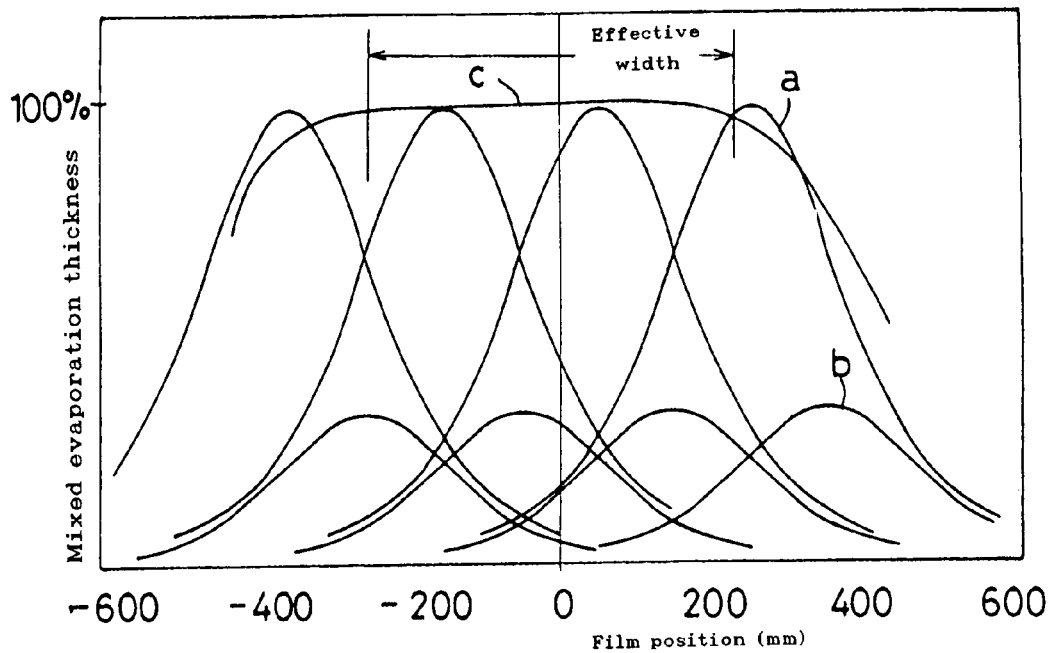
FIG. 4 is a graph for explaining evaporation characteristics and thickness distribution when the crucible of the embodiment is used.
Figure 5:
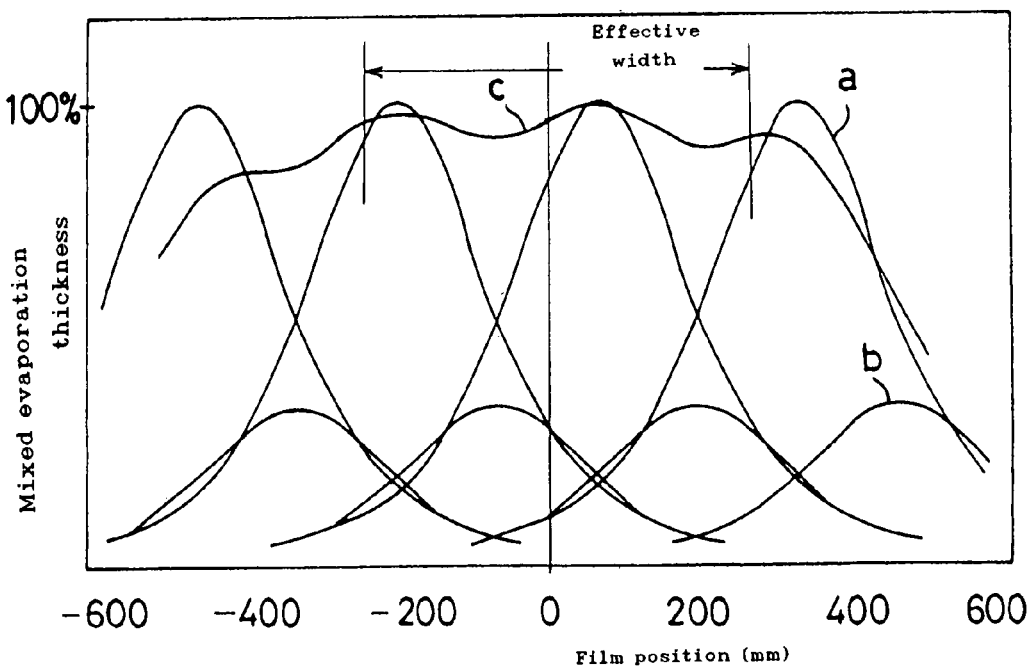
FIG. 5 is a graph for explaining evaporation characteristics and thickness distribution when a conventional crucible is used.

FIGS. 2 and 3 shows a schematic structure of the crucible 9 used in the present embodiment, and examples of arrangement in which the two kinds of evaporation materials are alternately and uniformly accommodated in each of the blocks secured by the partitioning plates 19, and FIGS. 4 and 5 show results of evaporation characteristics and thickness distribution when aluminum oxide A and silicon oxide S are alternately disposed in the crucible 9 of the present embodiment and a conventional crucible (thickness of side wall is 20 mm) and evaporated. In FIGS. 4 and 5, a represents film thickness distribution when aluminum oxide in one partition is evaporated, b represents thickness distribution when silicon oxide in one partition is evaporated, and c represents thickness distribution in TD. In FIGS. 4 and 5, axis of ordinates represents thickness of mixture evaporation film (thickness at each position is divided by maximum thickness and multiplied by 100), and axis of abscissas represents film position. From comparison between FIGS. 4 and 5, it can be found that film is evaporated uniformly in TD by the vacuum evaporation apparatus of the present embodiment as compared with the conventional apparatus.

Next, concrete experimental examples will be explained.

Example 1

Using the vacuum evaporation apparatus shown in FIG. 1, a thin film layer was evaporated while using SiO as evaporation raw material, and using, as a base plate, a polyethylene terephthalate (PET, hereinafter) film (produced by Toyobo Kabushiki Kaisha, ester film, production number E5100 (trade name)) having film width of 1,100 mm, film length 15,000 m and thickness of 12 μm. The monitor 7 employs wavelength dispersion system, and includes two proportional counters. X-rays were generated by X-ray tube under a condition of 50 kV and 40 mA, and the X-ray were irradiated to thin film. Fluorescent X-rays generated from the thin film were spectrally dispersed by spectral crystal plate, photon was counted by the proportional counters to measure the X-ray intensity. Prior to the measurement by the monitor 7, calibration curve showing a relation between the X-ray intensity and thickness of thin film was made using a plastic film that thickness of thin film on plastic film was known. Using this calibration curve, the evaporation film thickness (thickness of thin film on plastic film) was measured.

Since the PET film used includes silica as lubricant, X-ray intensity from the lubricant was previously corrected, and the evaporation film thickness was measured.

During the evaporation, oxygen gas was introduced into the evaporation chamber, and 20 nm was set as a target thickness of the thin film layer, and the film was evaporated. The obtained film was slit by a slitter, and formed into a take-up film (film roll) having width of 500 mm, and length of 4,000 m. For the take-up film (film roll), evaporation film thickness were measured at ten points by off-line thickness measuring mean using X-ray.

This take-up film was printed, and L6101 60 μm (produced by Toyobo Kabushiki Kaisha, polyethlene film LIX-1 (trade name)) was dry laminated on a thin film surface side of a barrier film. As an adhesive, a polyurethane adhesive (produced by Takeda Chemical Industries Ltd., Takelack A310/Takenate A-3 (trade name)) for dry lamination was used. The amount of the adhesive was 4 g/m².

An evaporation film (plastic film with thin film) was sampled, oxygen penetration amount was measured. Bending resistance was evaluated by carrying out Gelbo test.

<Measuring Method of Oxygen Permeability>

The oxygen permeability of the prepared gas barrier film was measured using an oxygen permeability measuring apparatus (produced by Modern controls Company, OX-TRAN10/50 (trade name)).

<Test Method of Bending Resistance (Gelbo, Hereinafter)>

The bending resistance was evaluated using a Gelbo flex tester (produced by Rigaku Kogyo Kabushiki Kaisha). A sample piece of 112 inches×8 inches was formed into cylindrical shape having 3 inches diameter (1/2) at (MIL-B131H), both ends of the cylindrical sample piece was held, initial grasping distance was set to 7 inches, it was twisted through 400° with 3 inches stroke (1/2), and this operation was repeated in reciprocating manner 40 times per minute at 23° C. and 65% relative humidity.

Comparative Example 1

Figure 6:
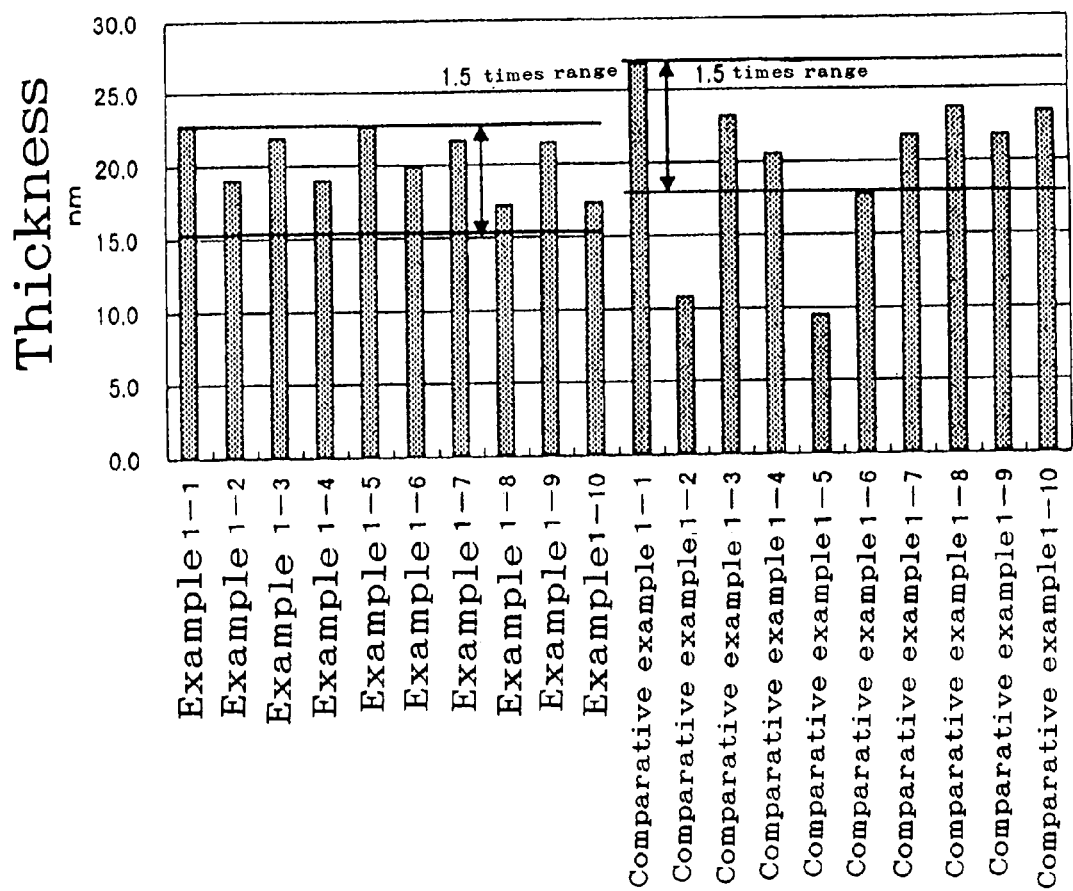
FIG. 6 is a graph showing thickness measurement results of Example 1 and Comparative example 1.

Conditions were the same as those in the example 1 except that an optical monitor was used instead of the fluorescent X-ray monitor of the vacuum evaporation apparatus. These results are shown in Table 1 and FIG. 6.

In the example 1, all the samples show stable gas barrier properties, but in the comparative example 1, some of the samples show inferior gas barrier properties and variation thereof is large.

TABLE 1

|  |  | Film thickness (nm) | Oxygen transmittance rate (cc/m²/24 h/atm) | |
|---|---|---|---|---|
|  |  |  | Laminated film | After Gelbo |
| Example | 1 - 1 | 22.8 | 1.1 | 3.1 |
| Example | 1 - 2 | 19.0 | 2.7 | 4.9 |
| Example | 1 - 3 | 21.9 | 2.7 | 3.3 |
| Example | 1 - 4 | 19.0 | 1.9 | 3.2 |
| Example | 1 - 5 | 22.6 | 2.1 | 2.1 |
| Example | 1 - 6 | 19.8 | 1.5 | 3.8 |
| Example | 1 - 7 | 21.7 | 2.2 | 3.5 |
| Example | 1 - 8 | 17.1 | 1.0 | 2.7 |
| Example | 1 - 9 | 21.4 | 1.6 | 3.8 |
| Example | 1 - 10 | 17.3 | 2.4 | 2.5 |
| Comparative example | 1 - 1 | 26.8 | 1.8 | 8.6 |
| Comparative example | 1 - 2 | 10.8 | 8.2 | 9.4 |
| Comparative example | 1 - 3 | 23.1 | 1.0 | 1.6 |
| Comparative example | 1 - 4 | 20.5 | 2.2 | 4.2 |
| Comparative example | 1 - 5 | 9.5 | 12.6 | 15.6 |
| Comparative example | 1 - 6 | 17.6 | 2.3 | 4.6 |
| Comparative example | 1 - 7 | 21.7 | 1.7 | 2.9 |
| Comparative example | 1 - 8 | 23.6 | 1.7 | 3.1 |
| Comparative example | 1 - 9 | 21.8 | 2.0 | 2.8 |
| Comparative example | 1 - 10 | 23.3 | 2.4 | 3.0 |

Example 2

The apparatus used in the example 1 was used. Using $SiO_2$ and $Al_2O_3$ as evaporation raw material, and using, as a base plate, a Ny film (produced by Toyobo Kabushiki Kaisha, harden film N2100 (trade name)) having width of 1,100 mm, length 15,000 m and thickness of 15 μm was evaporated to form a thin film layer. $SiO_2$ and $Al_2O_3$ were placed into separate crucibles, they were alternately heated by electron beams, and compound oxide of $SiO_2$ and $Al_2O_3$ was obtained as evaporation thin film layer. As a target, film thickness was set to 15 nm, and content ratio of $Al_2O_3$ was set to 30 wt %. The obtained film was slit by a slitter, and formed into a take-up film having width of 500 mm, and length of 4000 m, and thickness and composition of the thin films were measured at ten points using fluorescent X-ray analyzing apparatus, and the amount of oxygen transmittance was measured.

Comparative Example 2

Figure 7:
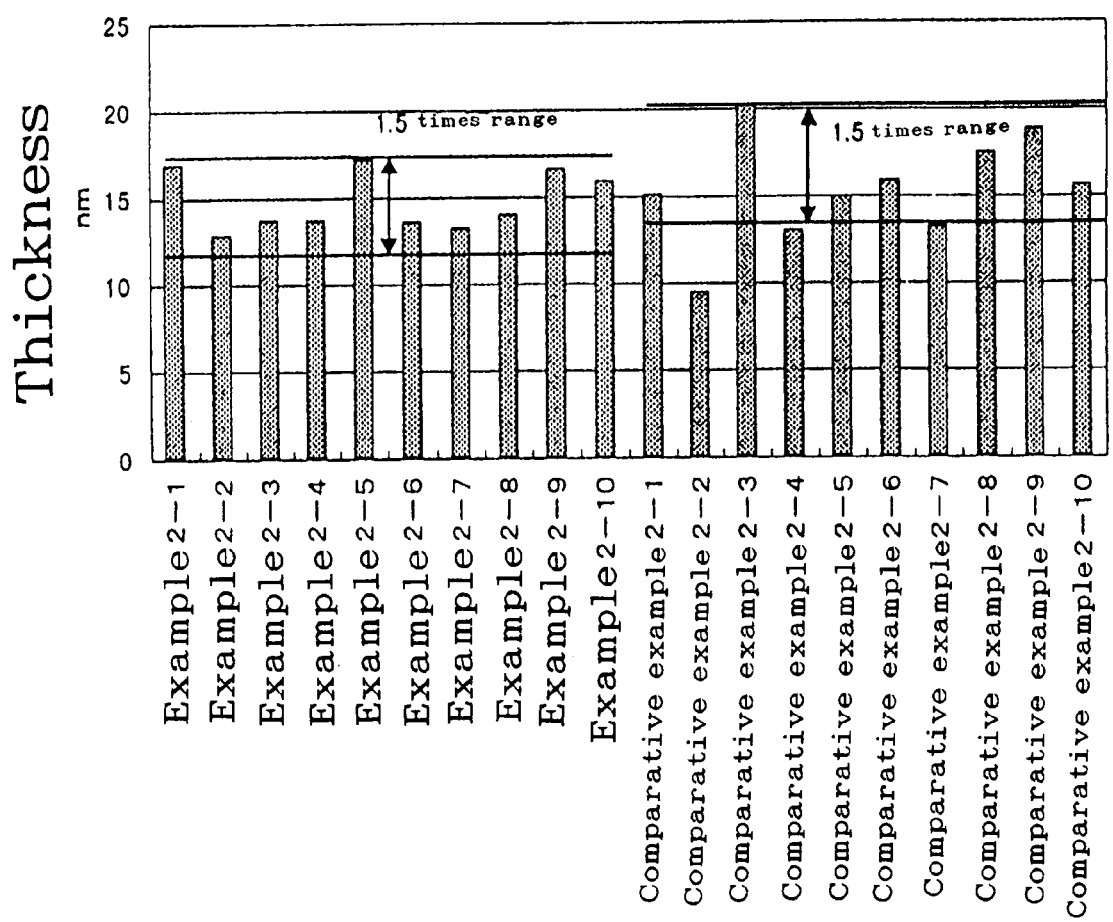
FIG. 7 is a graph showing thickness measurement results of Example 2 and Comparative example 2.
Figure 8:
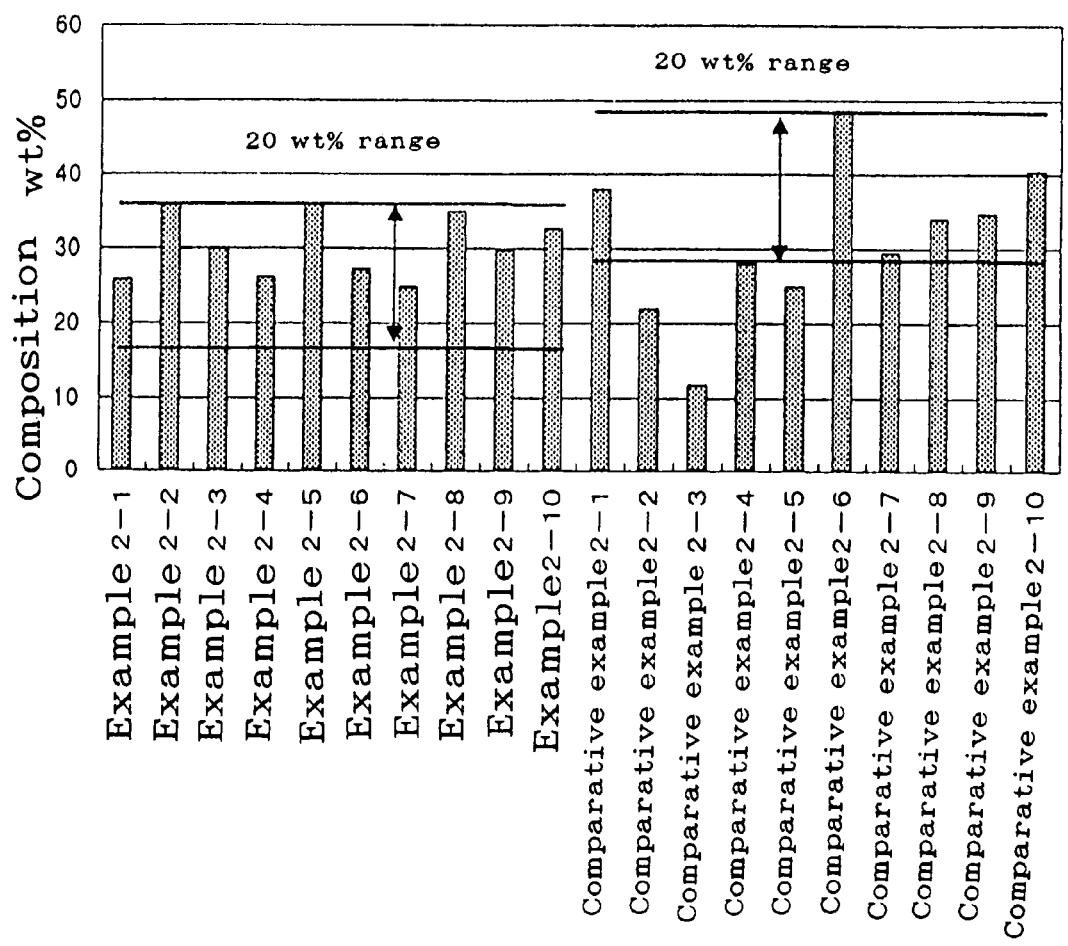
FIG. 8 is a graph showing component measurement results of Example 2 and Comparative example 2.

Conditions were the same as those in the example 2 except that an optical monitor was used instead of the fluorescent X-ray monitor of the vacuum evaporation apparatus. These results are shown in Table 2 and FIGS. 7 and 8.

In the embodiment 2, gas barrier properties are stable, but in the comparative example 2, gas barrier properties are largely varied and some of them show inferior gas barrier properties.

TABLE 2

|  |  | Film thickness (nm) | Composition (wt %) | Oxygen transmittance rate (cc/m²/24 h/atm) |
|---|---|---|---|---|
| Example | 2 - 1 | 16.9 | 25.9 | 2.9 |
| Example | 2 - 2 | 12.8 | 35.8 | 1.9 |
| Example | 2 - 3 | 13.7 | 30.0 | 2.6 |
| Example | 2 - 4 | 13.7 | 26.2 | 2.1 |
| Example | 2 - 5 | 17.2 | 36.0 | 1.5 |
| Example | 2 - 6 | 13.6 | 27.2 | 2.6 |
| Example | 2 - 7 | 13.2 | 24.9 | 1.3 |
| Example | 2 - 8 | 14.0 | 34.9 | 2.0 |
| Example | 2 - 9 | 16.6 | 29.7 | 2.7 |
| Example | 2 - 10 | 15.9 | 32.6 | 2.1 |
| Comparative example | 2 - 1 | 15.1 | 37.9 | 2.8 |
| Comparative example | 2 - 2 | 9.5 | 21.9 | 4.2 |
| Comparative example | 2 - 3 | 20.2 | 11.7 | 12.1 |
| Comparative example | 2 - 4 | 13.0 | 28.0 | 2.8 |
| Comparative example | 2 - 5 | 15.0 | 25.0 | 1.3 |
| Comparative example | 2 - 6 | 15.9 | 48.6 | 2.8 |
| Comparative example | 2 - 7 | 13.2 | 29.4 | 1.3 |
| Comparative example | 2 - 8 | 17.5 | 34.0 | 1.7 |
| Comparative example | 2 - 9 | 18.9 | 34.6 | 2.8 |
| Comparative example | 2 - 10 | 15.6 | 40.4 | 2.4 |

Results of printing properties will be shown next.

Example 3

The vacuum evaporation apparatus shown in FIG. 1 was used. A silicon oxide layer was formed on PET film (produced by Toyobo Kabushiki Kaisha, Toyobo ester film, production number E5100 (trade name)) having thickness of 12 µm, width of 1,000 mm, and length 25,000 m. SiO was used as evaporation material, and the film was evaporated at film moving speed of 200 m/min and target thickness of 80 nm. Variation in film thickness was within ±10 nm. 10 mm of both ears of the evaporated film was slit and removed using a voltage impressing type analyzer in a room having temperature of 23° C. and humidity of 65% and then was rewound.

The film was cut into 4,000 m and a take-up film (film roll) having width of 980 mm was prepared. The prepared take-up film was printed by a gravure printer, and the printed result was checked visually. Further, in accordance with a JIS K7126 B method, oxygen permeability of the film was measured at ten points using an Oxygen permeability measuring apparatus (produced by Modern Controls Company OX-TRAN100 (trade name)).

Comparative Example 3

A plastic film on which inorganic oxide layer is laminated was prepared in the same manner as the example 3 expect that the control using the film thickness monitor was not carried out. In a room having temperature of 23° C. and humidity of 30%, a diselectric apparatus was stopped and the film was wound back, and the film was cut at 4,000 m to prepare a take-up film of 980 mm in the widthwise direction in the same manner as the example 3. Thereafter, the same evaluation as that of the example 3 was carried out. The results are shown in Tables 3 to 6.

Printing was possible in the example 3, but failure was generated in the comparative example 3. Further, the oxygen permeability was stable and excellent gas barrier properties could be realized in the example 3, but in the comparative example, holes and thunder lines were generated due to static electricity, and the gas barrier properties of the transparent gas barrier film was not stable.

TABLE 3

|  | | Film thickness (nm) | |
| --- | --- | --- | --- |
|  | | Maximum value | Minimum value |
| Example | 3 | 87 | 77 |
| Comparative example | 3 | 89 | 61 |

TABLE 4

|  | | Static electoricity (kV) | |
| --- | --- | --- | --- |
|  | | Maximum value | Minimum value |
| Example | 3 | 0 | −3 |
| Comparative example | 3 | −15 | −23 |

TABLE 5

|  |  | Printed state |
| --- | --- | --- |
| Example | 3 | Excellent |
| Comparative example | 3 | There are failures such as mustache |

TABLE 6

|  | Oxygen transmittance rate (cc/m$^2$/24 h/atm) | | | | | | | | | |
| --- | --- | --- | --- | --- | --- | --- | --- | --- | --- | --- |
| Measured point | 1 | 2 | 3 | 4 | 5 | 6 | 7 | 8 | 9 | 10 |
| Example 3 | 1.63 | 1.83 | 1.74 | 1.23 | 1.22 | 1.60 | 1.54 | 1.14 | 1.48 | 1.34 |
| Comparative example 3 | 1.43 | 5.89 | 15.6 | over | 1.32 | 23.5 | over | 53.7 | 2.46 | 3.42 |

Another Embodiments of the Invention (a) The vacuum evaporation apparatus of the above embodiment may include correcting means which will be explained below. This vacuum evaporation apparatus has a structure substantially the same as the apparatus shown in FIG. 1 except the following points. That is, the measured characteristic X-ray intensity is converted into an analogue electric signal by the proportional counter 7c, the analogue electric signal is amplified by the amplifier 11 and then, converted into the digital signal by the analogue/digital converter 12, and the digital signal is sent to the correcting apparatus 23 constituting the correcting means where a necessary correction of the measurement value is made and then, the signal is converted into thickness at each of elements or thickness and composition ratio of each of the component by the thickness computing units 13. Finally converted thickness or thickness and the composition ratio is displayed and output by a thickness display 25 which is output means of thickness of inorganic oxide layer.

Figure 9:
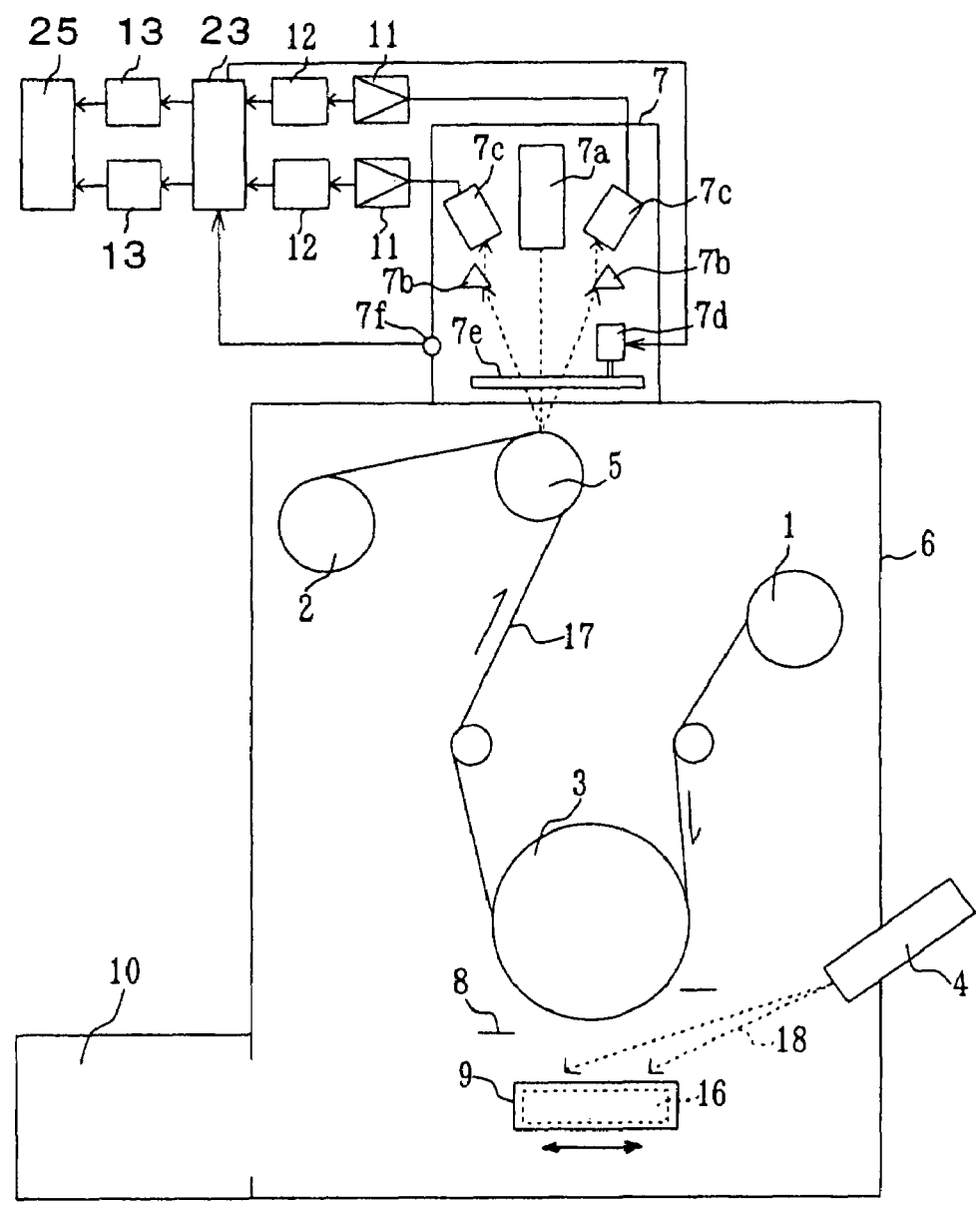
FIG. 9 is a schematic diagram of a vacuum evaporation apparatus according to another embodiment.
Figure 10:
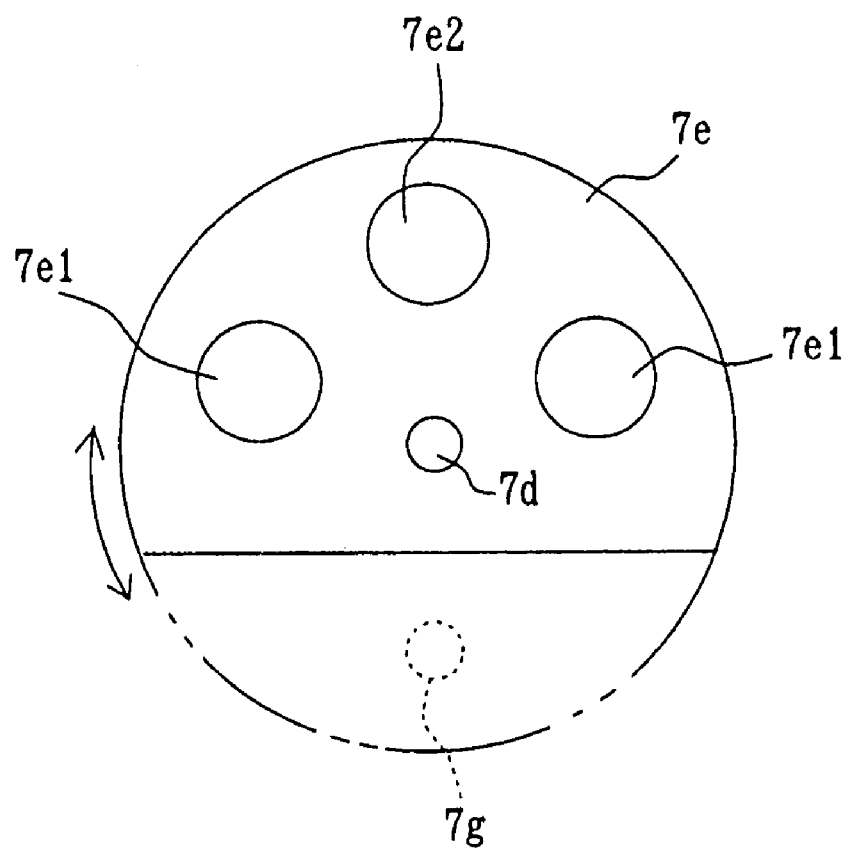
FIG. 10 is a schematic plan diagram of a standard plate used in the vacuum evaporation apparatus shown in FIG. 9.

The correcting apparatus 23 corrects the characteristic X-ray intensity measured by the characteristic X-ray measuring device based on measured value of the characteristic X-ray intensity obtained from a plurality of standard samples having known characteristics. That is, the standard sample comprises a component to be measured and having a predetermined thickness, and as shown in FIGS. 9 and 10, the sample is incorporated into a substantially semicircular standard plate 7e. The standard plate 7e comprises one or more thin plate-like standard samples 7e1 comprising component to be measured, and a reference sample 7e2.

The standard plate 7e is normally disposed on standby at a position deviated from an optical path irradiating X-rays, and when the measurement is started or during the measurement when measurement is carried out for a long time, the standard plate 7e moves to an X-ray irradiating optical path 7g by instructions of the correcting apparatus 23. That is, the standard sample 7e1 can move into and out from the X-ray irradiating optical path 7g by the standard plate driving means 7d comprising an electric motor and the like. Instructions can be sent to the correcting apparatus 23 by an operator if necessary from a separately provided input means (not shown). The standard plate 7e may be turned manually. The characteristic X-ray intensity of the standard sample 7e1 is measured by the standard plate 7e, and the characteristic X-ray intensity of a composite film which is the measured inorganic oxide layer is corrected based on the ratio of the characteristic X-ray of the preset reference plate 7e2. The corrected result may be stored in the correcting apparatus 23, or may be sent to the thickness computing unit 13 and converted into thickness.

Further, it is preferable that atmosphere temperature in the vicinity of the spectroscopic crystal plate 7b and the proportional counter 7c is detected by a temperature detector 7f disposed in the vicinity of the spectroscopic crystal plate 7b which is the characteristic X-ray measuring means and the proportional counter 7c, and the characteristic X-ray intensity of the measured inorganic oxide layer is further corrected based on previously obtained temperature dependency data of the proportional counter 7c. That is, a distance between spectral crystals of the spectroscopic crystal plate 7b is mainly varied by variation of the atmosphere temperature and as a result, the measured value of the proportional counter 7c is varied. Therefore, the temperature dependency data of the proportional counter 7c is previously obtained, and this is stored in the correcting apparatus 23. Then, the detected result by the temperature detector 7f is sent to the correcting apparatus 23, the temperature dependency data of the proportional counter 7c stored in the correcting apparatus 23 is taken into consideration, thereby correcting the characteristic X-ray intensity of the measured composite film. In this manner, by adding the correction by the standard sample, and by correcting it while taking the influence of the atmosphere temperature into consideration, the characteristic X-ray intensity can be corrected more precisely, and more precise measured result concerning the composite film thickness can be obtained.

The vacuum evaporation apparatus shown in FIG. 9 may be previously provided with the control amount computing unit and the electron beam gun control unit which are the same as those of the vacuum evaporation apparatus shown in FIG. 1, and the irradiation condition of the electron beams from the electron beam gun 4 may be controlled. In FIG. 9, a cooling tube for cooling the crucible 9 is omitted.

(b) The measuring roll 5 constituting the vacuum evaporation apparatus of the above embodiment eliminates the variation in irradiation distance from the X-ray generating apparatus 7a as small as possible as described above, bumps and dips on its roll surface and a roll-out width are small. In addition to this, the irradiation distance from the X-ray generating apparatus 7a may be measured, and a variation in thickness may be estimated from the measured result, and the irradiation condition of the electron beams may be corrected and controlled. As the distance measuring means, a measuring machine disposed in the vicinity of the X-ray measuring means can be employed. With such an arrangement, the thickness composition of the inorganic oxide layer is further stabilized, uniform thickness can be formed, and a functional roll film having excellent gas barrier properties can be produced.

Figure 11:
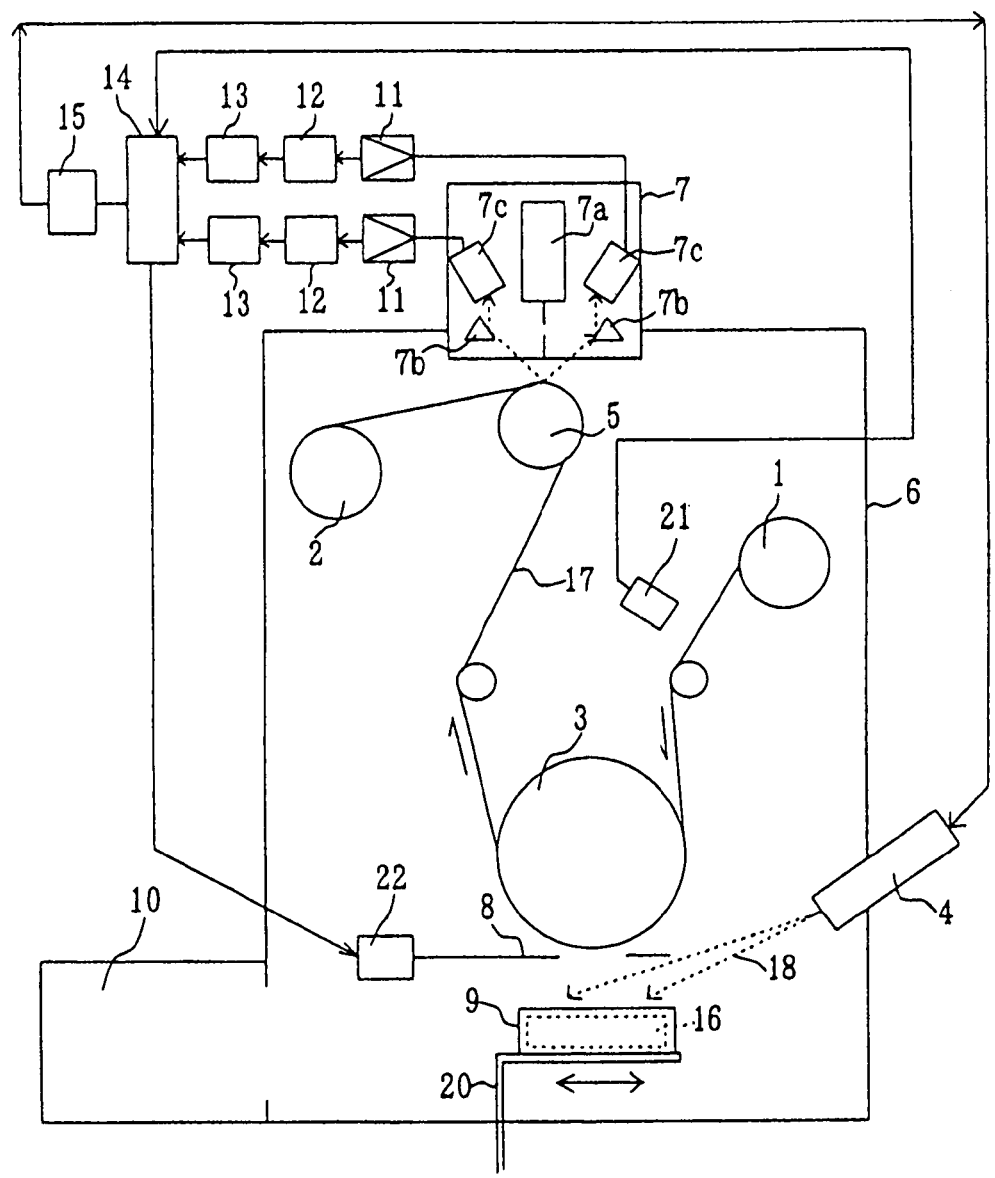
FIG. 11 is a schematic diagram of a vacuum evaporation apparatus according to another embodiment.

(c) The vacuum evaporation apparatus of the above embodiment includes the shutter 8 capable of opening and closing forming a uniform and excellent evaporation film on the plastic film 17. Further, as shown in FIG. 11, opening/closing control means 22 for opening and closing the shutter 8 to control whether the thin film comprising inorganic oxide layer is formed or not formed onto the plastic film 17, and by comparing the measured data when the thin film is formed and not formed, and by comparing the measured data when the thin film is formed and not formed, the characteristic X-ray intensity measured by the characteristic X-ray measuring means (7b, 7c) may be corrected.

That is, if particle having the same component as the material to be evaporated is included in the plastic film, when the shutter 8 provided between the evaporation material 16 and the moving film 17 is closed, thickness (equivalence) of the particle is measured and stored as thickness correcting base data of the inorganic oxide layer. During that time, the electron beam gun is not controlled, and when the shutter 8 is opened, thickness of the inorganic oxide layer evaporated onto the plastic film 17 is measured, the thickness of the inorganic oxide layer which is previously measured by the thickness computing unit 13 is corrected and then, the data are sent to the control amount computing unit 14. With such operation, it is possible to precisely measure the thickness of the inorganic oxide layer evaporated onto the plastic film 17.

This correction may be made by computing means separately provided between the thickness computing unit 13 and the control amount computing unit 14, or by computing function of the control amount computing unit 14.

In order to produce a functional roll film having stable thickness, stable composition and stable gas barrier properties based on the precisely measured thickness of the inorganic oxide layer, control data for controlling the electron beam gun is sent to the electron beam gun control apparatus 15 from the control amount computing unit 14. The electron beam gun control apparatus 15 controls electricity to be sent to the electron beam gun 4 and scanning time of the electron beams in accordance with the input control data. Then, opening and closing of the shutter 8 is controlled from the control amount computing unit 14 through the separately provided opening/closing control means 22.

Further, if a detection signal of a seam sensor which detects a seam of the plastic film 17 is input to the control amount computing unit 14, it is possible to open and close the shutter 8 with good timing in accordance with the detection signal. That is, the seam sensor 21 for detecting a seam is provided at midpoint of the running path of the plastic film 17 in the vacuum chamber 6, and when a seam is detected by this sensor 21, the shutter 8 is closed, and the above-described correction is made. With this arrangement, even when a long plastic film to which another plastic film having different particle density is added is continuously evaporated, the correction can be made without stopping the run of the plastic film and therefore, it is possible to precisely measure the thickness of the inorganic oxide layer.

As the seam detection sensor 21, an optical sensor or the like which detects a variation of light transmittance amount or variation in reflection amount can be employed. Since the optical sensor can detect the seam without touching the running plastic film, the latter should not be damaged and thus, it is convenient.

(d) Although the proportional counter is used as the characteristic X-ray measuring device in the above embodiment, a semiconductor detector may be used instead. If the semiconductor detector is used, the entire apparatus can be made compact, and even if a plurality of detectors are disposed, a large space is not occupied, the film can be measured at many points over the TD.

Figure 12:
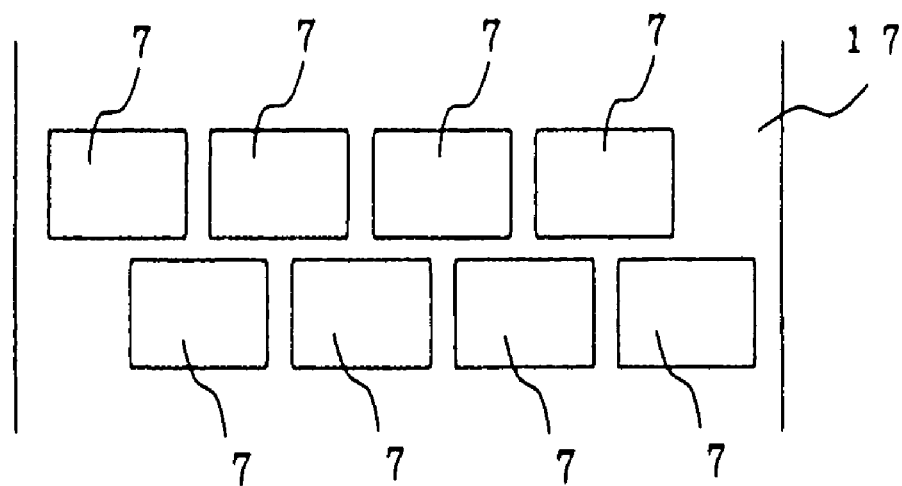
FIG. 12 are schematic plan diagrams of examples of arrangement of monitors.
Figure 12:
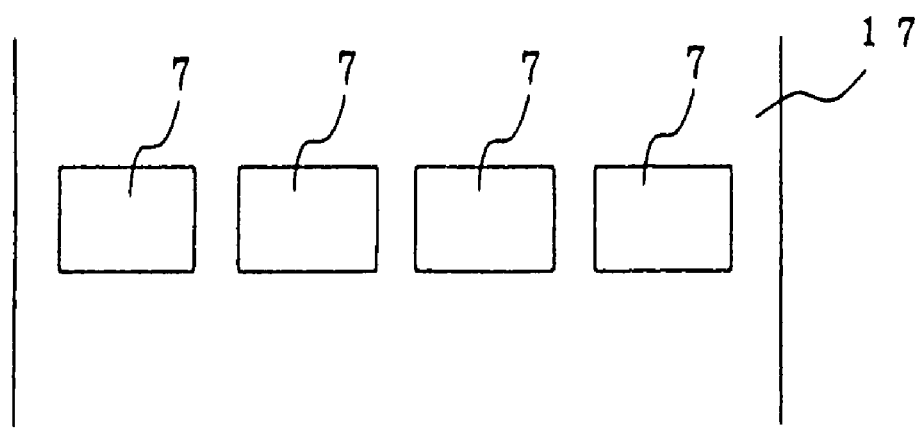

(e) As the thickness meter for measuring the inorganic oxide layer, a plurality of characteristic X-ray measuring means may be disposed together with X-ray irradiation means, and for example, the characteristic X-ray measuring means adjacent the MD of the moving plastic film 17 may be deviated from each other in the forward and backward directions into zigzag manner (e.g., FIG. 12(a)), or may be disposed on one line with respect to TD (e.g., FIG. 12(b)). In the drawings, 7 indicates that the above-described monitor is used as the thickness meter.

An example will be explained below.

Example 4

Using an electron beam heating evaporation apparatus in which three film thickness meters are disposed at distances of 400 m in one TD line such as to be opposed to the moving plastic film, evaporation was carried out. As an evaporation material, about 3 to 5 mm of aluminum oxide ($Al_2O_3$ having a purity of 99% or higher) and silicon oxide ($SiO_2$ having a purity of 95% or higher) were used. These evaporation materials were disposed on the TD using the crucible 9 shown in FIGS. 2 and 3 such that about 100 mm width of aluminum oxide and about 100 mm width of silicon oxide are arranged alternately until total width becomes 1,200 mm. As the plastic film, a nylon film (produced by Toyobo Kabushiki Kaisha, N2102 (trade name)) having width of 1,100 mm, thickness of 15 μm, and length of 12,000 m was used. A distance between the nylon film and the evaporation material is 350 mm, and the moving speed of the nylon film is 200 m/minute. A target film thickness of a mixture layer of the aluminum oxide and silicon oxide is 20 nm, and a target composition is aluminum oxide 30 wt %. Electricity of electron beams is about 100 kW. A mixture ratio of the aluminum oxide and silicon oxide was set to 7.3 ms of aluminum oxide and 2 ms of silicon oxide by adjusting the scanning time of the aluminum oxide and silicon oxide by electron beams. At the instant when about 7,000 m is evaporated, heating time of one of six aluminum oxide materials was set to 1 ms, electricity was set to about 90 kW, the evaporation was stopped and then, 3,000 m was evaporated.

The evaporated nylon film was cut into 1,000 m pieces to MD, and thickness and composition of the thin film were measured with 50 mm pitches. The measurement was carried out using a fluorescent X-ray analyzing apparatus (produced by Rigaku Denki, system 3270 (trade name)), and a calibration curve was determined using a known film which was previously analyzed by an ICP atomic emission spectroscopy apparatus. A specific gravity of film was measured using a float-and-sink analysis method. Further, since silica is included in the nylon film as lubricant, its influence was deleted by calculating influence from the film.

Measured results are shown in Tables 7 and 8. Output values from the thickness meter of 5,000 m and 10,000 m are shown in Tables 9 and 10.

TABLE 7

| TD position mm | MD position m | | | | | | | | | | |
|---|---|---|---|---|---|---|---|---|---|---|---|
|  | 0 | 1000 | 2000 | 3000 | 4000 | 5000 | 6000 | 7000 | 8000 | 9000 | 10000 |
| −500 | 13.2 | 13.1 | 13.0 | 13.1 | 13.2 | 13.5 | 13.0 | 13.6 | 12.4 | 12.5 | 13.0 |
| −450 | 15.3 | 14.7 | 15.1 | 14.9 | 15.3 | 15.3 | 14.3 | 15.0 | 14.9 | 14.4 | 14.5 |
| −400 | 16.4 | 16.1 | 16.2 | 16.5 | 16.0 | 16.1 | 15.8 | 16.2 | 15.9 | 15.9 | 15.6 |
| −350 | 17.1 | 17.5 | 17.8 | 17.6 | 17.1 | 17.0 | 17.3 | 16.9 | 17.1 | 16.8 | 17.1 |
| −300 | 18.5 | 17.7 | 18.3 | 18.0 | 18.3 | 18.7 | 18.7 | 18.2 | 17.5 | 17.5 | 17.0 |
| −250 | 18.7 | 18.5 | 18.5 | 18.4 | 18.9 | 18.6 | 19.2 | 19.3 | 17.6 | 17.5 | 17.4 |
| −200 | 19.4 | 19.0 | 19.5 | 19.3 | 19.7 | 19.7 | 19.5 | 19.7 | 18.0 | 18.0 | 18.6 |
| −150 | 19.8 | 19.9 | 19.5 | 19.4 | 19.5 | 19.3 | 19.4 | 20.2 | 18.6 | 18.6 | 18.2 |
| −100 | 20.2 | 19.6 | 19.4 | 20.3 | 20.2 | 20.1 | 19.9 | 20.4 | 18.3 | 18.9 | 19.1 |
| −50 | 19.8 | 19.6 | 20.0 | 19.7 | 20.2 | 20.2 | 19.6 | 19.6 | 18.5 | 18.5 | 19.1 |
| 0 | 20.1 | 20.4 | 20.2 | 20.2 | 19.7 | 20.2 | 20.1 | 19.9 | 19.7 | 19.7 | 19.4 |
| 50 | 20.5 | 19.8 | 19.8 | 20.4 | 19.9 | 20.1 | 20.6 | 20.1 | 19.9 | 19.1 | 19.6 |
| 100 | 19.7 | 19.7 | 20.2 | 20.0 | 20.1 | 20.3 | 20.3 | 19.8 | 19.1 | 19.3 | 19.7 |
| 150 | 20.0 | 19.9 | 20.4 | 19.7 | 19.5 | 19.6 | 20.3 | 20.5 | 19.4 | 19.4 | 19.6 |
| 200 | 19.5 | 20.0 | 19.8 | 19.9 | 19.7 | 20.0 | 19.5 | 19.6 | 20.0 | 20.0 | 19.3 |
| 250 | 19.8 | 19.5 | 19.1 | 19.7 | 19.6 | 19.6 | 19.3 | 19.2 | 19.0 | 18.9 | 19.6 |
| 300 | 19.2 | 19.6 | 19.3 | 19.0 | 19.1 | 19.2 | 18.9 | 18.9 | 18.9 | 19.3 | 18.5 |
| 350 | 18.7 | 18.3 | 18.6 | 18.5 | 18.3 | 18.3 | 18.8 | 18.2 | 18.3 | 18.6 | 18.8 |
| 400 | 17.9 | 18.0 | 17.5 | 17.4 | 17.8 | 17.2 | 17.3 | 17.5 | 17.7 | 17.6 | 17.6 |
| 450 | 16.6 | 16.9 | 16.5 | 16.9 | 16.6 | 16.4 | 16.8 | 16.8 | 16.5 | 16.8 | 16.5 |
| 500 | 15.6 | 15.2 | 15.2 | 15.8 | 15.6 | 15.2 | 15.0 | 15.8 | 15.6 | 15.7 | 15.5 |

Unit of film thickness nm

TABLE 8

| TD position mm | MD position m | | | | | | | | | | |
|---|---|---|---|---|---|---|---|---|---|---|---|
|  | 0 | 1000 | 2000 | 3000 | 4000 | 5000 | 6000 | 7000 | 8000 | 9000 | 10000 |
| −500 | 35.7 | 35.5 | 34.9 | 35.4 | 35.2 | 35.0 | 35.3 | 35.6 | 32.4 | 32.1 | 32.0 |
| −450 | 33.9 | 33.6 | 34.3 | 33.6 | 33.9 | 34.2 | 33.6 | 33.9 | 30.1 | 30.4 | 30.0 |
| −400 | 32.9 | 33.0 | 32.6 | 32.3 | 32.8 | 32.4 | 32.7 | 32.6 | 27.7 | 27.7 | 28.6 |
| −350 | 32.0 | 32.0 | 31.6 | 32.5 | 32.5 | 31.6 | 31.8 | 32.5 | 26.8 | 25.9 | 26.6 |
| −300 | 31.1 | 31.2 | 31.7 | 31.4 | 31.9 | 30.9 | 31.9 | 31.4 | 24.4 | 25.1 | 24.4 |
| −250 | 31.1 | 31.0 | 31.0 | 30.6 | 30.7 | 30.5 | 31.3 | 31.5 | 22.5 | 23.0 | 23.2 |
| −200 | 31.2 | 31.1 | 31.2 | 30.7 | 31.1 | 30.3 | 30.9 | 31.0 | 22.1 | 21.3 | 21.4 |
| −150 | 30.9 | 30.0 | 30.1 | 30.4 | 30.9 | 31.0 | 30.3 | 31.0 | 20.9 | 21.7 | 20.8 |
| −100 | 30.6 | 30.8 | 30.1 | 29.9 | 30.8 | 30.3 | 30.1 | 30.4 | 21.1 | 22.1 | 21.8 |
| −50 | 30.1 | 29.7 | 29.8 | 29.7 | 29.9 | 30.2 | 29.9 | 29.8 | 22.6 | 22.3 | 22.9 |
| 0 | 29.5 | 30.3 | 30.2 | 29.7 | 30.4 | 30.5 | 30.0 | 29.9 | 24.1 | 24.2 | 23.8 |
| 50 | 29.8 | 30.1 | 29.8 | 29.7 | 29.7 | 29.6 | 29.5 | 30.0 | 25.4 | 25.3 | 24.6 |
| 100 | 29.9 | 29.9 | 29.9 | 30.2 | 29.2 | 29.7 | 30.2 | 30.0 | 25.5 | 25.5 | 26.4 |
| 150 | 29.7 | 29.4 | 29.1 | 29.2 | 30.0 | 29.5 | 29.2 | 29.4 | 26.3 | 27.0 | 26.3 |
| 200 | 29.9 | 29.9 | 29.8 | 29.0 | 29.4 | 29.0 | 29.4 | 29.8 | 27.1 | 27.4 | 27.5 |
| 250 | 29.3 | 29.5 | 29.0 | 29.5 | 29.0 | 29.1 | 29.2 | 28.9 | 27.4 | 27.8 | 27.5 |
| 300 | 28.3 | 28.3 | 28.2 | 28.3 | 29.2 | 28.5 | 29.1 | 28.7 | 27.2 | 27.2 | 27.7 |
| 350 | 28.3 | 27.8 | 27.7 | 27.7 | 28.1 | 27.7 | 28.4 | 27.7 | 27.2 | 26.8 | 26.9 |

TABLE 8-continued

| TD position | MD position m | | | | | | | | | | |
|---|---|---|---|---|---|---|---|---|---|---|---|
| mm | 0 | 1000 | 2000 | 3000 | 4000 | 5000 | 6000 | 7000 | 8000 | 9000 | 10000 |
| 400 | 26.9 | 27.6 | 27.1 | 27.6 | 27.7 | 27.0 | 27.3 | 27.0 | 26.3 | 26.9 | 26.8 |
| 450 | 26.4 | 26.4 | 26.2 | 26.8 | 27.0 | 26.6 | 26.5 | 26.1 | 25.6 | 25.9 | 26.1 |
| 500 | 25.8 | 25.7 | 24.8 | 25.5 | 25.5 | 25.0 | 25.6 | 25.0 | 24.4 | 24.9 | 24.8 |

Unit is content of aluminum oxide wt %

TABLE 9

Film thickness (nm)

| | | TD (mm) | | |
|---|---|---|---|---|
| | | −400 | 0 | 400 |
| MD (m) | 5000 | 16.6 | 19.8 | 18.0 |
| | 10000 | 16.1 | 18.8 | 17.1 |

TABLE 10

Content of Al$_2$O$_3$ in film (wt %)

| | | TD (mm) | | |
|---|---|---|---|---|
| | | −400 | 0 | 400 |
| MD (m) | 5000 | 32.9 | 30.1 | 27.1 |
| | 10000 | 28.2 | 23.7 | 26.5 |

Figure 13:
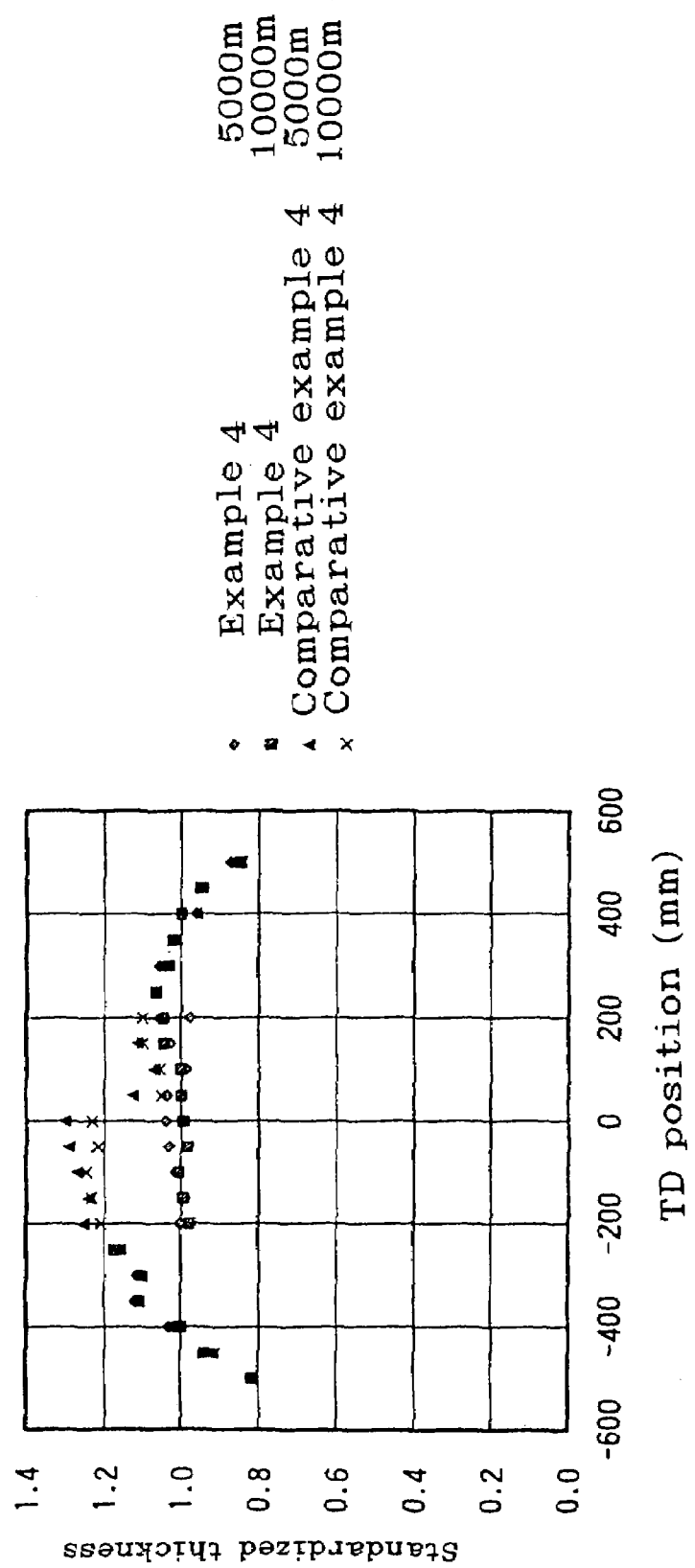
FIG. 13 is a graph showing a variation in thickness of plastic film TD positions of Example 4 and Comparative example 4.

Thickness at each point is shown in FIG. 13 while determining the thickness output of the thickness meter as a reference value. Values at positions between the film thickness meters which were not measured by the thickness meters in a range of −400 mm to 400 mm while determined a center of the plastic film in the TD as being 0 were also within a range of about ±20% with respect to values measured by the thickness meters.

Comparative Example 4

The condition was the same as the embodiment 4 except that the thickness meters were not disposed between −400 mm and 400 mm. In the case of this comparative example 4, as shown in FIG. 13, thickness values between −400 mm and 400 mm were varied more than ±20%.

Example 5

A thickness and composition were estimated from the thickness and composition distribution function obtained in the example 4. The evaporation distribution characteristics were obtained using an equation of a thin wire-like evaporation source based on evaporation rule (cos θ rule) of a generally known point evaporation source. The equation used is shown below. The evaporation distribution functions of aluminum oxide and silicon oxide were the same. In the following equation, C represents a constant, L represents length of evaporation source, h represent a distance from the evaporation source and a plastic film surface, and x represents a position of TD of the plastic film. The obtained results are shown in Tables 11 and 12. It can be found that variations of both the thickness and the composition are small.

TABLE 11

| | 5000 m | | 10000 m | |
|---|---|---|---|---|
| TD position mm | Estimated value | Mesured value | Estimated value | Mesured value |
| −500 | 14 | 14 | 14 | 13 |
| −450 | 16 | 15 | 16 | 15 |
| −400 | 17 | 16 | 17 | 16 |
| −350 | 18 | 17 | 18 | 17 |
| −300 | 19 | 19 | 19 | 17 |
| −250 | 19 | 19 | 19 | 17 |
| −200 | 20 | 20 | 20 | 19 |
| −150 | 20 | 19 | 20 | 18 |
| −100 | 20 | 20 | 20 | 19 |
| −50 | 20 | 20 | 20 | 19 |
| 0 | 20 | 20 | 20 | 19 |
| 50 | 20 | 20 | 20 | 20 |
| 100 | 20 | 20 | 20 | 20 |
| 150 | 20 | 20 | 20 | 20 |
| 200 | 19 | 20 | 19 | 19 |
| 250 | 19 | 20 | 19 | 20 |
| 300 | 19 | 19 | 19 | 19 |
| 350 | 18 | 20 | 19 | 19 |
| 400 | 18 | 17 | 18 | 18 |
| 450 | 17 | 16 | 17 | 17 |
| 500 | 15 | 15 | 15 | 15 |

In the table, numeric values show film thickness (nm)

TABLE 12

| | 5000 m | | 10000 m | |
|---|---|---|---|---|
| TD position mm | Estimated value | Mesured value | Estimated value | Mesured value |
| −500 | 34 | 35 | 30 | 32 |
| −450 | 33 | 34 | 28 | 30 |
| −400 | 32 | 32 | 27 | 29 |
| −350 | 31 | 32 | 26 | 27 |
| −300 | 31 | 31 | 25 | 24 |
| −250 | 31 | 30 | 24 | 23 |
| −200 | 30 | 30 | 24 | 21 |
| −150 | 30 | 31 | 24 | 21 |
| −100 | 30 | 30 | 24 | 22 |
| −50 | 30 | 30 | 24 | 23 |
| 0 | 30 | 31 | 24 | 24 |
| 50 | 30 | 30 | 24 | 25 |
| 100 | 29 | 30 | 25 | 26 |
| 150 | 29 | 29 | 25 | 26 |
| 200 | 29 | 29 | 26 | 27 |
| 250 | 28 | 29 | 26 | 28 |
| 300 | 28 | 29 | 26 | 28 |
| 350 | 27 | 28 | 27 | 27 |
| 400 | 26 | 27 | 26 | 27 |

TABLE 12-continued

| TD position mm | 5000 m | | 10000 m | |
|---|---|---|---|---|
| | Estimated value | Mesured value | Estimated value | Mesured value |
| 450 | 25 | 27 | 26 | 26 |
| 500 | 24 | 25 | 25 | 25 |

In the table, numeric values show content of aluminum oxide in the evaporation layer (wt %).

$$f(x)=C[L\{h^2-x^2+(L^2/4)\}]/\{(h^2+x^2)^2+(L^2/2)(h^2-x^2)+(L^4/16)\}+1/h[\tan^{-1}[\{(L/2)+x\}/h]+\tan^{-1}[\{(L/2)-x\}/h]]$$

(f) The control amount computing unit 14 of the vacuum evaporation apparatus shown in FIG. 1 may be provided with the following mechanism. In such a case, a plurality of monitors 7 as thickness meters which measure the inorganic oxide layer are disposed in the TD of the plastic film 17 as shown in FIG. 12(a) or 12(b).

This control amount computing apparatus 14 collects thickness information from the a plurality of monitors 7 disposed in the TD of the plastic film 17, and based on the information, the thickness distribution of all the TD of the plastic film 17 is calculated in accordance with the following equation.

$$Y_n = \sum_{i=1}^{m} V_i \cdot D(x_{ni}, f)$$

Here, $Y_n$ represents thickness measurement data in each of the monitors, Vi represents evaporation speed of each of the evaporation sources, D represents evaporation amount distribution function of each of the evaporation sources, x represents a relative distance between a position of subject monitor and a subject evaporation source, f represents a distribution fitting constant, i represents a crucible number, m represents the number of evaporation sources, and n represents a monitor number.

Deviation amounts of reference distribution data previously set for each of the evaporation sources (each of ideal evaporation distribution data required to evaporate on the entire width of the plastic film into target composition and thickness) is obtained. Based on the following relational equation concerning the deviation amounts, energy amount previously set for each of the evaporation sources and evaporation speed, control PID (Proportional Integral Derivative) calculation is carried out, the energy amount to be applied to each of the evaporation sources is determined so as to keep the evaporation film uniform.

$$ta_n=[Pa_n/(\Sigma Pa+\Sigma Ps)]\times to$$

Here, $ta_n$ represents electron beam scanning time at an evaporation source block n in a crucible having A component, $Pa_n$ represents energy to be applied at the evaporation source block n in the crucible having A component, $\Sigma Pa$ represents a total sum energy amount to be applied at the evaporation source block in the crucible having A component, $\Sigma Ps$ represents a total sum energy amount to be applied at the evaporation source block in the crucible having another component, and to represents a time constant (ms) depending on hardware.

The control amount computing unit 14 determines power (output) of the electron beam gun from a sum total of energy amount of the evaporation sources, and determines a time during which electron beams are irradiated to the evaporation sources from the energy amount ratio of the evaporation sources. The control data (power of the electron beam gun and irradiation time) are sent to the electron beam gun control unit 15. Here, the control amount computing unit 14 includes functions of evaporation distribution estimating means, first control amount computing means for determining the output power of the electron beam gun, and second control amount computing means for determining the electron beam irradiating time. These functions may be divided into separate control amount computing units.

The electron beam gun control unit 15 as the electron control means controls the power to be applied to the electron beam gun 4 and the irradiation time of electron beams. On-line measuring portions of the plurality of monitors 7 are independently constructed, and the control amount computing unit 14 and the electron beam gun control unit 15 are commonly constructed.

With such a structure, when an inorganic oxide layer, especially a composite oxide layer in which different kinds of oxides are mixed is formed, since the characteristic X-ray can be measured directly in real time from the composite thin film formed on the moving plastic film by evaporation component evaporated from each of the evaporation sources disposed in the TD of the plastic film, it is possible to convert the measured value into thickness of each of the mixed film components, or to convert into a total thickness of the mixed film and composition. Further, since the amount of energy to be applied to each of the evaporation sources can be extracted with high precision based on the actual thickness and actual composition information, thereby automatically controlling the electron beam gun, it is possible to uniformly and stably form the composite thin film having the target composition and thickness continuously for a long time over the TD and MD of the plastic film and thus, it is convenient.

Figure 14:
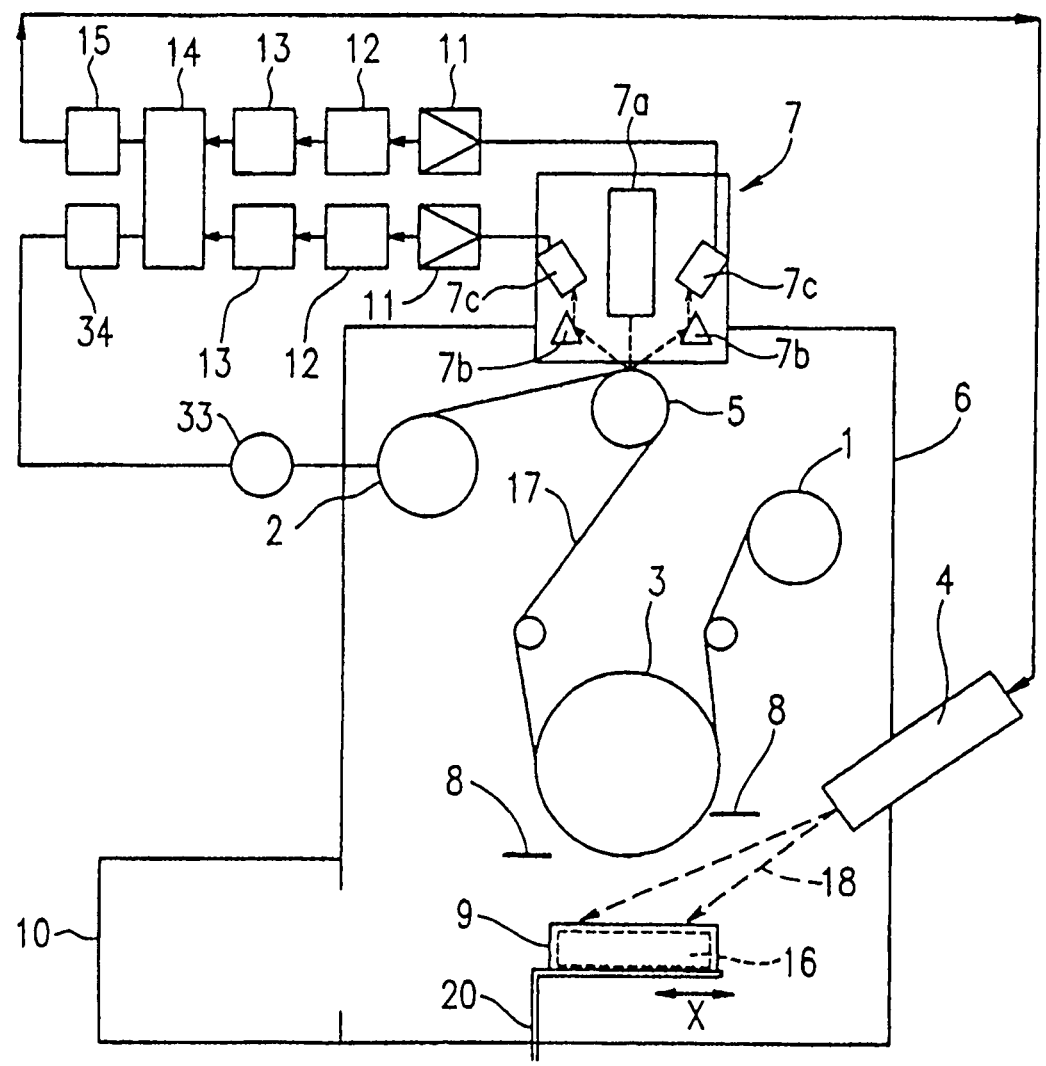
FIG. 14 is a schematic diagram of a vacuum evaporation apparatus according to another embodiment.

(g) The vacuum evaporation apparatus may be provided with means for controlling the moving speed of the plastic film based on the measured data of the inorganic oxide layer. For example, as shown in FIG. 14, there can be considered a mechanism that a speed control circuit 34 is connected next to the control amount computing unit 14 separately from the electron beam gun control unit 15, and the moving speed of the plastic film 17 is changed in association with data which control the electron beam gun. That is, when the control amount of the electron beams an upper limit value or a lower limit value of a preset control amount, the control amount computing unit 14 sends a control signal for changing the speed of the moving plastic film 17 to the speed control circuit 34. The speed control circuit 34 controls the engine speed of the motor 33 in accordance with input speed data. With this arrangement, it is possible to obtain more uniform thickness or thickness and composition ratio of inorganic oxide layer.

(h) In the above embodiment, the crucible made of copper is indicated as a container for the evaporation material holding means, but the present invention is not limited to this, and other material may be used if the material is less prone to be damaged by heating means such as electron beams. The container may be of basket-like shape if it can hold the evaporation material, the heating means is not limited to the electron beam gun, and the heating means may employ a resistance heating system or induction heating system.

(i) In the above embodiment, a so-called one chamber type is indicated as the vacuum chamber, but the present invention can also be applied to a so-called two chamber type apparatus in which a chamber for moving a material to be evaporated such as a film and a chamber for heating the evaporation material are brought into different evacuated states, thereby carrying out the vacuum evaporation.

(j) In the above embodiment, the rewinding roll and the winding roll of the material to be evaporated are disposed in the vacuum chamber, but the rewinding roll and the winding roll may be disposed outside of the vacuum chamber in which evaporation is carried out, and the evaporation may be carried out continuously in a high vacuum chamber.

(k) As the evaporation material, various elements and compounds can be used in addition to the above-described aluminum oxide and silicon oxide, and a composite film comprising more than two kinds of elements or components may be formed using more than two kinds of evaporation materials.

(l) It is possible to employ various modification or improvement examples which are not described in the present specification within a range of technical idea described in claims, and such modification or improvement examples belong to the range of present invention.

What is claimed is:

1. A functional roll film comprising:
   a transparent plastic film having gas barrier properties, and having a 10-50 nm thick inorganic oxide layer on at least one surface, wherein said inorganic oxide layer is deposited by vacuum evaporation,
   wherein the plastic film has a width of at least 400 mm and a length of at least 4,000 meters,
   wherein the inorganic oxide layer on a portion measuring at least 400 mm width by at least 4,000 meter length of the plastic film has a maximum thickness that is equal to or less than 1.5 times the minimum thickness as measured over both the width and length directions.

2. A functional roll film according to claim 1, wherein said inorganic oxide layer comprises a composite oxide having two components, wherein the difference between a maximum wt % and a minimum wt % of one component of the composite oxide in said one roll unit of the plastic film is within 20 wt %.

3. A functional roll film according to claim 1, wherein said plastic film has a width of at least 1,000 mm and a length of at least 15,000 m.

4. A functional roll film according to claim 2, wherein said plastic film has a width of at least 1,000 mm and a length of at least 15,000 m.

5. A functional roll film according to claim 1, wherein said plastic film has a width of 400 to 1,000 mm and a length of 4,000 to 10,000 m.

6. The functional roll film of claim 1, wherein the inorganic oxide layer consists substantially of one or more inorganic oxides.

7. A functional roll film comprising:
   a transparent plastic film having gas barrier properties, and having a 10-50 nm thick inorganic oxide layer on at least one surface, wherein said inorganic oxide layer is deposited by vacuum evaporation,
   wherein the plastic film has a width of at least 400 mm and a length of at least 4,000 meters,
   wherein the inorganic oxide layer on a portion measuring at least 400 mm width by at least 4,000 meter length of the plastic film has a maximum thickness that is equal to or less than 1.5 times the minimum thickness as measured over both the width and length directions,
   wherein static electricity of said plastic film having said inorganic oxide layer is in a range from −10 kV to +10 kV.

8. The functional roll film of claim 7, wherein the inorganic oxide layer consists substantially of one or more inorganic oxides.

* * * * *